(12) United States Patent
Liu et al.

(10) Patent No.: US 10,199,930 B2
(45) Date of Patent: *Feb. 5, 2019

(54) FREQUENCY MODULATION BASED VOLTAGE CONTROLLER CONFIGURATION

(71) Applicant: Skyworks Solutions, Inc., Woburn, MA (US)

(72) Inventors: Hui Liu, Marion, IA (US); Timothy James Mansheim, Cedar Rapids, IA (US); David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/453,788

(22) Filed: Mar. 8, 2017

(65) Prior Publication Data

US 2017/0279350 A1  Sep. 28, 2017

Related U.S. Application Data

(63) Continuation of application No. 14/869,092, filed on Sep. 29, 2015, now Pat. No. 9,621,034.

(Continued)

(51) Int. Cl.
*H02M 3/07* (2006.01)
*H03K 7/06* (2006.01)
*H03K 17/00* (2006.01)

(52) U.S. Cl.
CPC ............... *H02M 3/07* (2013.01); *H03K 7/06* (2013.01); *H03K 17/005* (2013.01)

(58) Field of Classification Search
CPC ............ H02M 3/00; H02M 3/04; H02M 3/06; H02M 3/07; H02M 3/072; H02M 3/16;
(Continued)

(56) References Cited

U.S. PATENT DOCUMENTS 4,497,054 A   1/1985   Read
4,719,447 A   1/1988   Garuts
(Continued)

FOREIGN PATENT DOCUMENTS

CN   1474500   2/2004
CN   1909348   2/2007
(Continued)

OTHER PUBLICATIONS

Search Report and Written of dated Aug. 26, 2011 for International Application No. PCT/US2010/058274, filed on Nov. 30, 2010. 8 pages.

*Primary Examiner* — William Hernandez
(74) *Attorney, Agent, or Firm* — Knobbe, Martens, Olson & Bear, LLP

(57) ABSTRACT

A voltage converter can be switched among two or more modes to produce an output voltage tracking a reference voltage that can be of an intermediate level between discrete levels corresponding to the modes. One or more voltages generated from a power supply voltage, such as a battery voltage, can be compared with the reference voltage to determine whether to adjust the mode. The reference voltage can be independent of the power supply voltage. Further, the voltage converter may implement frequency modulation and a pulse skipping mode to improve the efficiency of switching operational states of the voltage converter.

17 Claims, 22 Drawing Sheets

Related U.S. Application Data

(60) Provisional application No. 62/057,477, filed on Sep. 30, 2014, provisional application No. 62/057,465, filed on Sep. 30, 2014, provisional application No. 62/057,627, filed on Sep. 30, 2014.

(58) Field of Classification Search
CPC . H02M 3/18; H02M 3/20; H03K 7/06; H03K 17/005
USPC .................................. 327/102, 113, 124, 306
See application file for complete search history.

(56) References Cited

U.S. PATENT DOCUMENTS

| | | | |
|---|---|---|---|
| 5,227,781 A | 7/1993 | Ninnis | |
| 6,055,168 A * | 4/2000 | Kotowski | H02M 3/07 307/110 |
| 6,169,673 B1 * | 1/2001 | McIntyre | H02M 3/07 363/59 |
| 6,198,645 B1 | 3/2001 | Kotowski et al. | |
| 6,226,193 B1 * | 5/2001 | Bayer | H02M 3/07 363/59 |
| 6,373,340 B1 | 4/2002 | Shashoua | |
| 6,429,635 B2 * | 8/2002 | Okubo | H02M 3/07 323/271 |
| 6,504,349 B2 * | 1/2003 | Jaworski | H02M 3/07 307/110 |
| 6,531,792 B2 | 3/2003 | Oshio | |
| 6,753,623 B2 | 6/2004 | McIntyre et al. | |
| 7,286,069 B1 | 10/2007 | Duewer et al. | |
| 7,342,389 B1 | 3/2008 | Wu et al. | |
| 8,040,162 B2 | 10/2011 | Miyazaki | |
| 8,537,579 B2 * | 9/2013 | Ripley | H02M 3/06 363/59 |
| 8,704,408 B2 | 4/2014 | Becker et al. | |
| 8,749,308 B2 | 6/2014 | Wilson | |
| 8,848,947 B2 * | 9/2014 | Poulsen | H03F 1/0272 330/260 |
| 9,054,575 B2 * | 6/2015 | Ripley | H02M 3/06 |
| 9,106,183 B2 * | 8/2015 | Liu | H02M 3/07 |
| 9,136,795 B2 * | 9/2015 | Liu | H02M 3/07 |
| 9,634,558 B2 * | 4/2017 | Feng | H02M 3/07 |
| 9,812,954 B1 * | 11/2017 | Kose | H02M 3/07 |
| 2001/0038279 A1 | 11/2001 | Jaworski | |
| 2007/0052471 A1 | 3/2007 | Ng | |
| 2009/0072800 A1 | 3/2009 | Ramadass et al. | |
| 2009/0309566 A1 | 12/2009 | Shiu | |
| 2011/0128761 A1 | 6/2011 | Ripley et al. | |
| 2011/0128762 A1 | 6/2011 | Ripley et al. | |
| 2012/0188017 A1 | 7/2012 | Qian | |
| 2015/0054550 A1 | 2/2015 | Koyama | |
| 2015/0236583 A1 | 8/2015 | Ripley et al. | |
| 2016/0094126 A1 | 3/2016 | Liu et al. | |
| 2016/0094213 A1 | 3/2016 | Liu et al. | |
| 2016/0094214 A1 | 3/2016 | Liu et al. | |

FOREIGN PATENT DOCUMENTS

| | | |
|---|---|---|
| CN | 101478234 | 7/2009 |
| JP | 2007-336722 | 12/2007 |

* cited by examiner

| V_23 | V_12 | V_13 | V_UD | NEXT MODE | HOLD |
|---|---|---|---|---|---|
| 0 | 0 | 0 | 0 | N/A | 1 |
| 0 | 0 | 0 | 1 | 1/3 | 0 |
| 0 | 0 | 1 | 0 | 1/3 | 0 |
| 0 | 1 | 1 | 1 | 1/2A | 0 |
| 0 | 1 | 1 | 0 | 1/2B | 0 |
| 1 | 1 | 1 | 1 | 2/3 | 0 |
| 1 | 1 | 1 | 0 | 2/3 | 0 |
| | | | 1 | Vbatt | 0 |

FIG.9A

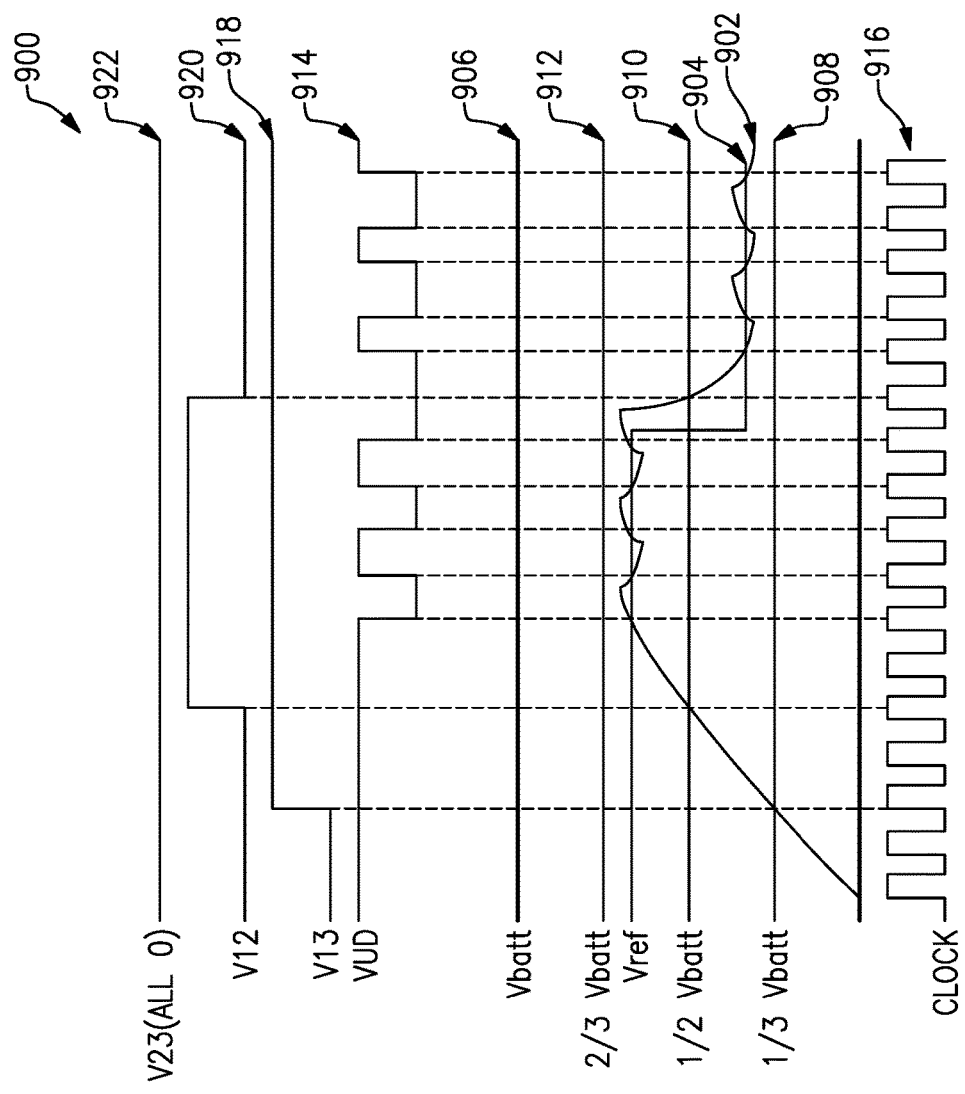

FREQUENCY MODULATION BASED VOLTAGE CONTROLLER CONFIGURATION

RELATED APPLICATIONS

This disclosure is a continuation of U.S. application Ser. No. 14/869,092, which was filed Sep. 29, 2015 and is titled "FREQUENCY MODULATION BASED VOLTAGE CONTROLLER CONFIGURATION," the disclosure of which is hereby incorporated by reference herein in its entirety, and which claims priority to the following provisional applications: U.S. Provisional Application No. 62/057,465, which was filed on Sep. 30, 2014 and is titled "VARIABLE SWITCHED DC-TO-DC VOLTAGE CONVERTER USING PULSE SKIPPING MODE AND FREQUENCY MODULATION;" U.S. Provisional Application No. 62/057,477, which was filed on Sep. 30, 2014 and is titled "FREQUENCY MODULATION BASED VOLTAGE CONTROLLER CONFIGURATION;" and U.S. Provisional Application No. 62/057,627, which was filed on Sep. 30, 2014 and is titled "FREQUENCY MODULATION AND PULSE SKIPPING MODE VOLTAGE CONTROLLER," the disclosures of which are each expressly incorporated by reference herein in their entirety. Further, this application is related to U.S. application Ser. No. 14/868,968, which was filed on Sep. 29, 2015 and is titled "VARIABLE SWITCHED DC-TO-DC VOLTAGE CONVERTER USING PULSE SKIPPING MODE AND FREQUENCY MODULATION;" and U.S. application Ser. No. 14/868,970, which was filed on Sep. 29, 2015 and is titled "FREQUENCY MODULATION AND PULSE SKIPPING MODE VOLTAGE CONTROLLER," the disclosures of which are each expressly incorporated by reference herein in their entirety.

BACKGROUND

Technical Field

The disclosed technology relates to electronic systems and, in particular, to DC-to-DC voltage converters.

Description of Related Technology

One type of device that converts one direct current ("DC") voltage level to another DC voltage level may be referred to as a DC-to-DC converter (DC-DC converter). DC-DC converters can be included in battery-operated devices such as mobile telephones, laptop computers, etc., in which the various subsystems of the device require several discrete voltage levels. In some types of devices, such as a mobile telephone that operates in a number of different modes, it can be desirable to supply certain elements, such as power amplifiers, with a supply voltage at a more efficient level for the mode of operation, rather than waste power and accordingly drain the battery prematurely. In such devices, it can be desirable to employ a DC-DC converter that can generate a number of discrete voltage levels.

Some example DC-DC converters include switched-mode DC-DC converters and DC-DC converters that employ pulse-width modulation (PWM). Switched-mode DC-DC converters can convert one DC voltage level to another DC voltage level by storing the input energy momentarily or temporarily in inductors and/or capacitors and then releasing that energy to the output at a different voltage. The switching circuitry can thus continuously switch between two states or phases: a first state in which a network of inductors and/or capacitors is charging, and a second state in which the network is discharging. The switching circuitry can generate an output voltage that is a fixed fraction of the battery voltage, such as one-third, one-half, two-thirds, etc., where a mode selection signal can be provided as an input to the switching circuitry to control which of the fixed fractions is to be employed. Different configurations of the network of inductors and/or capacitors can be selected by manipulating switches in the network based on the mode selection signal.

The number of discrete output voltages that a switched-mode DC-DC converter can generate can be related to the number of inductors and/or capacitors in the switching circuitry. In a portable, handheld device such as a mobile telephone it can be desirable to minimize size and weight. A DC-DC converter having a relatively large number of inductors and/or capacitors may not be conducive to minimizing the size and weight of a mobile telephone. A PWM-based DC-DC converter can generate a larger number of discrete voltages than a switched-mode DC-DC converter without employing significantly more inductors, capacitors and/or other circuit elements. However, a PWM based DC-DC converter can generate a relatively large spectrum of spurious output signals that can adversely affect the operation of a mobile telephone or other frequency-sensitive device. Filters having relatively large capacitances and/or inductances can be included in a PWM-based DC-DC converter to minimize these spurious signals, but large filter capacitors and/or inductors can be undesirable for at least the reasons relating to size and weight described above.

SUMMARY

Aspects of this disclosure relate to an apparatus including a switch matrix that includes switches configurable into a plurality of states corresponding to a plurality of voltage levels of an output voltage. The switch matrix may be configured to adjust a state of at least one of the switches based at least in part on one or more switch control signals. Further, the apparatus may include control logic configured to receive a first voltage and a second voltage, compare the first voltage with the second voltage, modify a frequency of an oscillator signal based at least in part on the result of the comparison, and generate a switch control signal from the one or more switch control signals.

Further, the control logic may be further configured to reduce the frequency of the oscillator signal as a difference between the first voltage and the second voltage decreases. In addition, the control logic may be further configured to reduce the frequency of the oscillator signal to a minimum frequency when the difference between the first voltage and the second voltage is negative. Moreover, the control logic may be further configured to transition the apparatus into a pulse skipping mode based at least in part on the comparison of the first voltage with the second voltage.

In certain implementations, the apparatus includes an oscillator configured to generate the oscillator signal in response to a current generated based at least in part on the result of comparison of the first voltage and the second voltage. In addition, the apparatus may also include a voltage controlled current source (VCCS) configured to generate the current and provide the current to the oscillator. The VCCS may be an operational transconductance amplifier (OTA).

Some designs of the apparatus may include a clock generator configured to generate one or more clock signals for the switch matrix. The one or more clock signals may be based at least in part on the oscillator signal. Further, the apparatus may include a switch controller configured to configure the switch matrix based on the switch control signal. In some such cases, the control logic is further configured to provide the switch control signal to the switch controller. Moreover, the apparatus may also include a capacitor in electrical communication with the switch matrix. The switch controller may be further configured to charge or discharge the capacitor based on the switch control signal.

Other aspects of this disclosure relate to a wireless device that can include a battery configured to power the wireless device and a power amplifier configured to amplify a radio frequency (RF) input signal and to generate an amplified RF output signal. Further, the wireless device can include a voltage controller including a switch matrix and control logic. The switch matrix may include switches configurable into a plurality of states corresponding to a plurality of voltage levels of an output voltage. Moreover, the switch matrix may be configured to adjust a state of at least one of the switches based at least in part on one or more switch control signals. The control logic can be configured to receive a first voltage and a second voltage, compare the first voltage with the second voltage, modify a frequency of an oscillator signal based at least in part on the result of the comparison, and generate a switch control signal from the one or more switch control signals.

The control logic, in certain cases, may be further configured to reduce the frequency of the oscillator signal as a difference between the first voltage and the second voltage decreases. Further, the control logic may be further configured to reduce the frequency of the oscillator signal to a minimum frequency when the difference between the first voltage and the second voltage is negative. In addition, the control logic may be further configured to transition the apparatus into a pulse skipping mode based at least in part on the comparison of the first voltage with the second voltage.

In some implementations, the voltage controller further includes an oscillator and a voltage controlled current source (VCCS). This VCCS may be configured to generate a current based at least in part on the result of the comparison and to provide the current to the oscillator. Further, the oscillator may be configured to generate the oscillator signal based at least in part on the current. In some cases, the VCCS is an operational transconductance amplifier (OTA).

Yet other aspects of this disclosure relate to a multi-chip module that can include a power amplifier die including one or more power amplifiers. Further, the multi-chip module may include a controller die including a power amplifier bias controller and a voltage converter. The voltage converter may include a switch matrix and control logic. The switch matrix can include switches configurable into a plurality of states corresponding to a plurality of voltage levels of an output voltage. Moreover, the switch matrix may be configured to adjust a state of at least one of the switches based at least in part on one or more switch control signals. The control logic can be configured to receive a first voltage and a second voltage, compare the first voltage with the second voltage, modify a frequency of an oscillator signal based at least in part on the result of the comparison, and generate a switch control signal from the one or more switch control signals.

In some designs, the control logic of the voltage converter may be further configured to set the frequency of the oscillator signal based at least in part on a difference between the first voltage and the second voltage. Moreover, the control logic may be further configured to transition the apparatus into a pulse skipping mode based at least in part on the comparison of the first voltage with the second voltage. In addition, in some designs, the voltage controller further includes an oscillator and a voltage controlled current source (VCCS). The VCCS may be configured to generate a current based at least in part on the result of the comparison and to provide the current to the oscillator. This oscillator can be configured to generate the oscillator signal based at least in part on the current provided by the VCCS.

One aspect of this disclosure relates to an apparatus that can include a switch matrix configured to output a plurality of voltage levels. The apparatus can further include an oscillator configured to generate an oscillator signal at a frequency and a clock generator configured to generate a clock signal based on the oscillator signal. In addition, the apparatus can include control logic that includes a first input coupled to an output voltage and a second input coupled to a reference voltage. The output voltage may correspond to a feedback voltage output by the switch matrix. The control logic can further include a comparator configured to compare the output voltage with the reference voltage. Moreover, the control logic can be configured to, based at least in part on the comparison, modify the frequency of the oscillator signal and generate the one or more mode control signals for setting a mode of the switch matrix.

In some cases, the control logic may further include a voltage controlled current source (VCCS) configured to modify the frequency of the oscillator signal. The VCCS may be an operational transconductance amplifier (OTA).

Moreover, the control logic may be further configured to modify the frequency of the oscillator signal based at least in part on a difference between the output voltage and the reference voltage when the reference voltage exceeds the output voltage. In addition, the control logic may be further configured to reduce the frequency of the oscillator signal as the difference between the output voltage and the reference voltage is reduced. Further, the control logic may be further configured to set the oscillator signal to a minimum threshold frequency when the output voltage exceeds the reference voltage. In addition, the control logic may be further configured to deactivate the switch matrix when the output voltage exceeds the reference voltage.

In certain implementations, the apparatus also includes a plurality of capacitive circuit elements operatively coupled to the switch matrix. In some such implementations, the switch matrix is further configured to implement a plurality of modes, each mode having a first phase configuration in which at least one of the plurality of capacitive circuit elements is charged and a second phase configuration in which the at least one of the plurality of capacitive circuit elements is discharged. Further, the control logic may cause causes the switch matrix to implement a mode from the plurality of modes having the second phase configuration when the output voltage exceeds the reference voltage.

Moreover, the comparator may be a hysteresis comparator. In addition, the reference voltage may correspond to a target voltage for the output voltage. This reference voltage may be specified based on an operating environment for the apparatus.

Another aspect of this disclosure relates to a wireless device that can include a battery configured to power the wireless device and a power amplifier configured to amplify a radio frequency (RF) input signal and to generate an amplified RF output signal. Further, the wireless device can include a direct current to direct current (DC-DC) voltage converter configured to generate an output voltage to control the power amplifier so as to improve power efficiency. The DC-DC voltage converter may include a switch matrix, an oscillator, a clock generator, and control logic. The switch matrix may be configured to output a plurality of voltage levels. The oscillator can be configured to generate an oscillator signal at a frequency and the clock generator can be configured to generate a clock signal based on the oscillator signal. Further, the control logic may include a first input coupled to an output voltage and a second input coupled to a reference voltage. The output voltage may correspond to a feedback voltage output by the switch matrix. Moreover, the control logic may further include a comparator configured to compare the output voltage with the reference voltage. The control logic may be configured to, based at least in part on the comparison, modify the frequency of the oscillator signal and generate the one or more mode control signals for setting a mode of the switch matrix.

The control logic, in some designs, further includes a voltage controlled current source (VCCS) configured to modify the frequency of the oscillator signal. Further, the control logic may be further configured to modify the frequency of the oscillator signal by reducing the frequency of the oscillator signal to a minimum operating frequency when the output voltage exceeds the reference voltage and to deactivate the switch matrix when the output voltage exceeds the reference voltage. Moreover, the control logic can be further configured to modify the frequency of the oscillator signal by reducing the frequency of the oscillator signal in proportion to a difference between the output voltage and the reference voltage when the reference voltage exceeds the output voltage.

In some implementations, the DC-DC voltage converter is configured to transition into a pulse skipping mode based at least in part on the comparison of the output voltage with the reference voltage. Further, at least one of the one or more switches may have a plurality of sub-switches. At least one of the plurality of sub switches may be configured to change states based at least in part on an amount of current provided by the DC-DC voltage converter. Further, in some designs the comparator of the control logic is a hysteresis comparator.

A further aspect of this disclosure relates to a method that includes generating a first voltage using a DC-DC voltage converter. The method may further include comparing the first voltage generated by the DC-DC voltage converter with a second voltage that is independent of the first voltage to obtain a comparison signal. In addition, the method may include setting a frequency of an oscillator signal based at least partially on the comparison signal. The oscillator signal may be used to generate a clock signal for the DC-DC voltage converter.

The method may further include deactivating a switch matrix of the DC-DC voltage converter responsive to the comparison signal. In addition, the method may include setting the second voltage based on an operating environment of a device including the DC-DC voltage converter. In some cases, the comparing of the first voltage with the second voltage is further based on a hysteresis value.

Aspects of this disclosure relate to a voltage converter that can include a switch matrix including a set of switches configurable into a plurality of states corresponding to a plurality of voltage levels associated with a supply voltage. The set of switches may be in electrical communication with a supply voltage. Further, the switch matrix can be configured to adjust a state of at least one of the set of switches based at least in part on one or more switch control signals. In addition, the switch matrix may be further configured to output a first voltage. Moreover, the voltage converter can include an oscillator configured to generate an oscillator signal at a frequency and a clock generator configured to generate a clock signal based on the oscillator signal. In addition, the voltage converter may include control logic configured to produce the one or more switch control signals based at least in part on a comparison between the first voltage and a second voltage. The second voltage may be supplied as an input to the voltage converter. Further, the control logic can be further configured to generate a frequency control signal for modifying the frequency of the oscillator. The frequency control signal may be based at least in part on the comparison between the first voltage and the second voltage.

In some implementations, the voltage converter further includes a frequency modulation (FM) controller configured to modify the frequency of the oscillator to generate a modified oscillator signal. The FM controller, in some cases, is further configured to supply the modified oscillator signal to the clock generator. In addition, the FM controller may be further configured to modify the frequency of the oscillator based at least in part on the comparison between the first voltage and the second voltage. In some cases, the FM controller is further configured to reduce the frequency of the oscillator as the difference between the first voltage and the second voltage decreases. Moreover, the FM controller can be further configured to reduce the frequency to a default frequency upon the first voltage exceeding the second voltage. This default frequency may correspond to a threshold frequency for operation of the oscillator.

Some designs of the FM controller include a voltage controlled current source (VCCS) configured to provide a current signal to the oscillator. The VCCS may be an operational transconductance amplifier (OTA). Further, the current signal may be based at least in part on the comparison between the first voltage and the second voltage.

In some implementations, the voltage converter further includes at least one capacitor in electrical communication with the switch matrix. The at least one capacitor can be configured to enable the plurality of voltage levels. Further, the capacitor may be charged or discharged based at least in part on a configured state from the plurality of states of the switch matrix.

Other aspects of this disclosure relate to a wireless device that can include a battery configured to power the wireless device and a power amplifier configured to amplify a radio frequency (RF) input signal and to generate an amplified RF output signal. Further, the wireless device may include a voltage converter including a switch matrix, an oscillator, a clock generator, and control logic. The switch may include a set of switches configurable into a plurality of states corresponding to a plurality of voltage levels associated with a supply voltage. Moreover, the set of switches may be in electrical communication with a supply voltage. In addition, the switch matrix can be configured to adjust a state of at least one of the set of switches based at least in part on one or more switch control signals. Further, the switch matrix may be further configured to output a first voltage. The oscillator can be configured to generate an oscillator signal at a frequency and the clock generator can be configured to generate a clock signal based on the oscillator signal. Moreover, the control logic can be configured to produce the one or more switch control signals based at least in part on a comparison between the first voltage and a second voltage. The second voltage can be supplied as an input to the voltage converter. In addition, the control logic can be further configured to generate a frequency control signal for modifying the frequency of the oscillator. The frequency control signal may be based at least in part on the comparison between the first voltage and the second voltage.

In some implementations, the set of switches are field-effect transistors (FETs). In addition, the voltage converter may further include a frequency modulation (FM) controller configured to modify the frequency of the oscillator to generate a modified oscillator signal and to supply the modified signal to the clock generator. The FM controller may include a voltage controlled current source (VCCS) configured to provide a current signal to the oscillator, the modified signal supplied to the clock generator output by the oscillator and based at least in part on the current signal. Moreover, the voltage converter may be configured to transition into a pulse skipping mode based at least in part on the comparison of the first voltage with the second voltage.

Yet other aspects of the present disclosure relate to a multi-chip module that can include a power amplifier die including one or more power amplifiers and a controller die including a power amplifier bias controller and a voltage converter. The voltage controller can include a switch matrix, an oscillator, a clock generator, and control logic. The switch may include a set of switches configurable into a plurality of states corresponding to a plurality of voltage levels associated with a supply voltage. The set of switches may be in electrical communication with a supply voltage. Further, the switch matrix may be configured to adjust a state of at least one of the set of switches based at least in part on one or more switch control signals. The switch matrix can be further configured to output a first voltage, the oscillator may be configured to generate an oscillator signal at a frequency, and the clock generator may be configured to generate a clock signal based on the oscillator signal. Further, the control logic can be configured to produce the one or more switch control signals based at least in part on a comparison between the first voltage and a second voltage. The second voltage may be supplied as an input to the voltage converter. In addition, the control logic may be further configured to generate a frequency control signal for modifying the frequency of the oscillator. The frequency control signal may be based at least in part on the comparison between the first voltage and the second voltage.

In some implementations, the voltage converter further includes a frequency modulation (FM) controller configured to modify the frequency of the oscillator to generate a modified oscillator signal and to supply the modified signal to the clock generator. Further, the FM controller may include a voltage controlled current source (VCCS) configured to provide a current signal to the oscillator. The modified signal can be supplied to the clock generator output by the oscillator and may be based at least in part on the current signal. Moreover, the voltage converter may be configured to transition into a pulse skipping mode based at least in part on the comparison of the first voltage with the second voltage.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 9A is a truth table associated with example mode selection logic of FIG. 3A and FIG. 3B.

FIG. 9B is an example signal graph illustrating the application of the example mode selection logic reflected in the truth table of FIG. 9A.

DETAILED DESCRIPTION

Figure 1A:
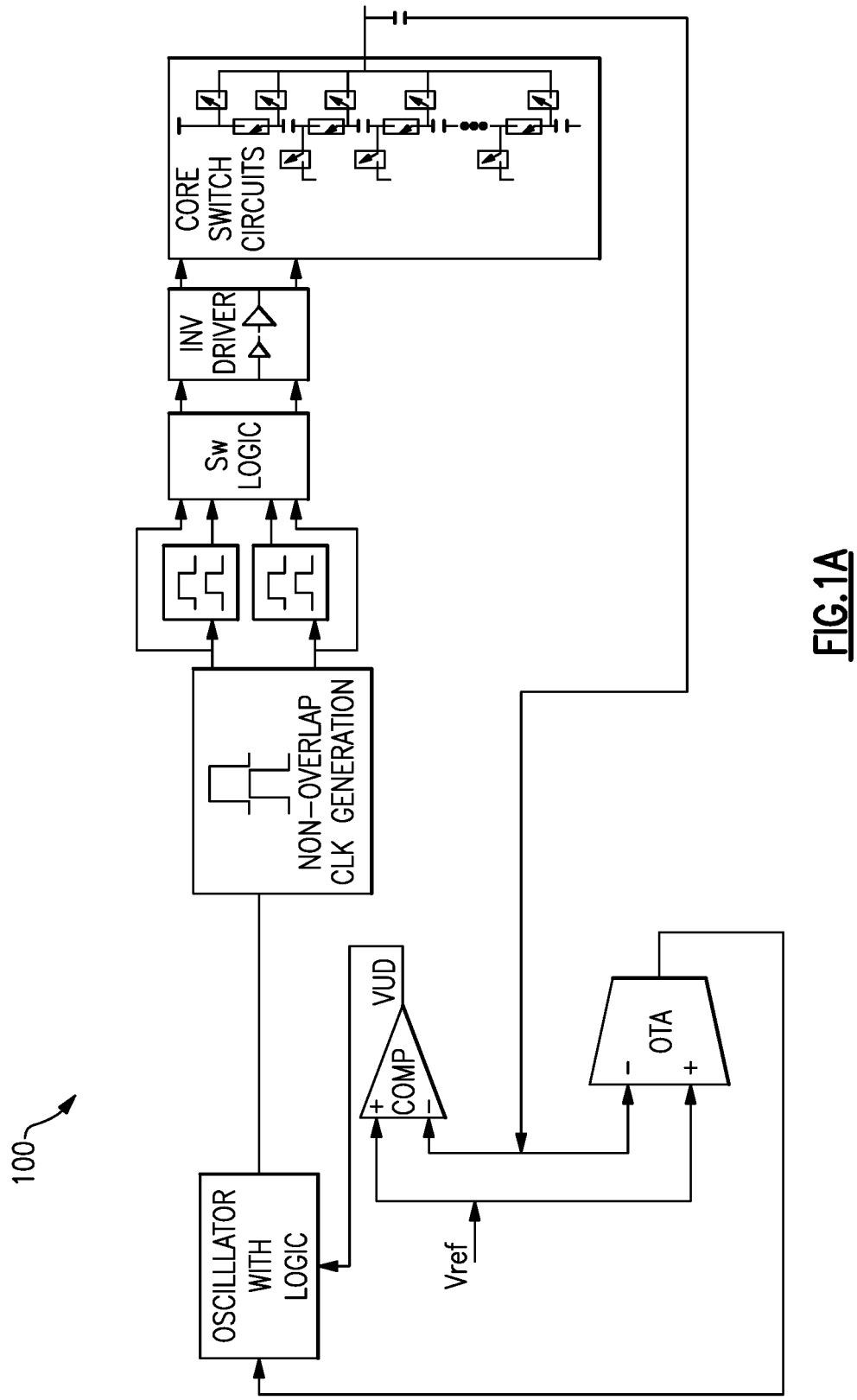
FIG. 1A is a schematic block diagram of an example voltage converter that can implement frequency modulation (FM).

Generally described, aspects of the present disclosure relate to DC-DC voltage conversion. More specifically, some implementations relate to variable switched capacitor DC-DC converters. Using the voltage conversion systems, apparatus, and methods described herein, electronic systems, such as power amplifier systems, can operate more efficiently and/or consume less power. For instance, power amplifier biasing can be made more efficient. A switched capacitor architecture can utilize feedback to dynamically select switch mode and generate a control voltage. Switch sizes and/or switching frequency can be dynamically adjusted.

DC-DC converters that use pulse width modulation (PWM) architectures can generate undesirable output spectrum including noise. In such PWM architectures, the output noise spectrum may require an LC filter that includes a large inductive element that is expensive to implement and can radiate energy. Switched capacitor architectures can remove the need for LC filters that include large inductive elements. However, some switched capacitor architectures may be configured to generate discrete voltage levels that are a function of an input supply voltage and a capacitor division ratio.

Advantageously, a switched DC-DC capacitor architecture can use feedback to dynamically select a division ratio of a voltage converter by toggling between various output states. As a result, an intermediate voltage can be generated over a continuous range between a lowest division mode and a highest division mode.

The methods, systems, and apparatus for voltage conversion described herein may be able to achieve one or more of the following advantageous features, among others. An output noise spectrum can be reduced compared to conventional PWM architectures. The switched capacitor architecture can be modeled as an RC filter with a corner frequency related to a switching frequency and capacitors. Low pass characteristics of the filter can allow for elimination of the conventionally large inductors used in an LC filter network and/or support integration into a small package foot print or co-integration with power amplifier products.

The use of feedback described herein can further reduce the noise spectrum on an output of a voltage converter. The feedback can also improve the tolerance of a voltage converter to noise and/or jitter on the output of the voltage regulator.

The switch control methods described herein can use comparator circuits to optimize effective switch size based on reference voltage and/or power amplifier output power levels. Alternatively or additionally, the comparator circuits can be used to optimize switching frequency based on reference voltage and/or power amplifier output power levels.

One or more outputs of the comparator circuit can be used to optimize a bias current based on different reference voltage. The bias profile can also track the reference voltage like a power amplifier collector voltage.

The feedback methods and methods to adjust switch size, switching frequency, and power amplifier biasing according to an input reference voltage can make the power amplifier more efficient. This can lead to reduced power consumption and extended battery life in systems powered by a battery.

The headings provided herein are for convenience only and do not necessarily affect the scope or meaning of the claimed invention.

Overview of Voltage Converter

FIG. 1A is a schematic block diagram of an example voltage converter 100 that can implement frequency modulation (FM). As will be described in more detail herein, the voltage converter 100 can implement both a pulse skipping mode (PSM) and frequency modulation (FM). Advantageously, implementing both PSM and FM enables the voltage converter 100 to more efficiently achieve a desired output voltage compared to a voltage converter that does not implement both PSM and FM. Further, the voltage converter 100 is able to avoid the problems or drawbacks associated with deactivating the oscillator of the voltage converter, such as the time required to restart or reinitialize the oscillator when an output voltage drops below a desired value.

As is described in more detail below, the voltage converter 100 can gradually adjust the frequency of the clock signal by basing, at least in part, the oscillator output on a current generated by an operational trans-conductance amplifier (OTA). The OTA can base, at least in part, its generated current on a difference between the output voltage and the designed voltage (e.g., a reference voltage). As the difference narrows or widens, the current output by the OTA can change. Further, details regarding the implementation and advantages of the voltage converter using both PSM and FM are described in more detail below.

Overview of Wireless Devices

Figure 1B:
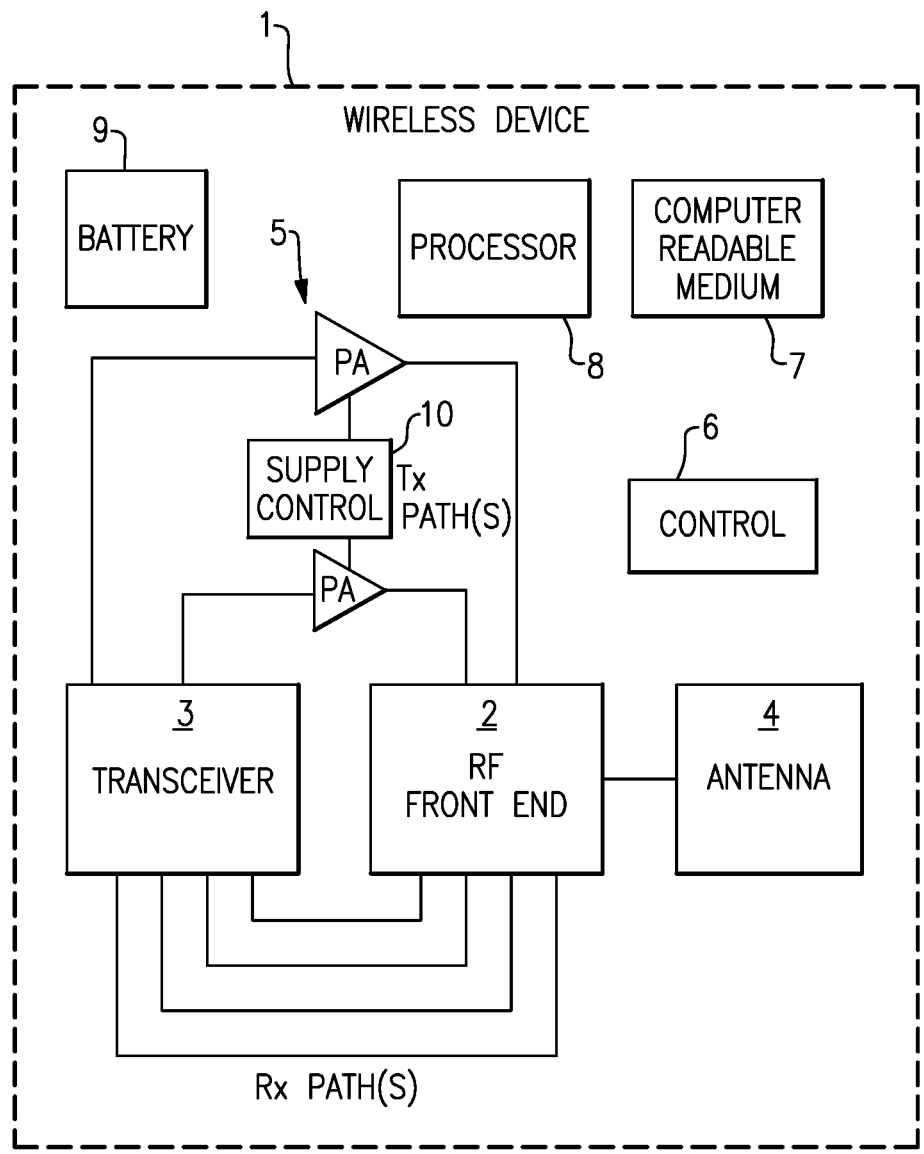
FIG. 1B is a schematic block diagram of an illustrative wireless device.

Any of the methods, apparatus, and computer-readable media for DC-DC voltage conversion described herein can be implemented in a variety of electronic devices, such as a wireless device, which can also be referred to as a mobile device. FIG. 1B schematically depicts a wireless device 1. Examples of the wireless device 1 include, but are not limited to, a cellular phone (e.g., a smart phone), a laptop, a tablet computer, a personal digital assistant (PDA), a wearable device (e.g., a smartwatch or an optical head-mounted device), an electronic book reader, and a portable digital media player. For instance, the wireless device 1 can be a multi-band and/or multi-mode device such as a multi-band/multi-mode mobile phone configured to communicate using, for example, a Global System for Mobile Communications (GSM) network, a code division multiple access (CDMA) network, a 3G network, a 4G network, and/or a long term evolution (LTE) network.

In certain embodiments, the wireless device 1 can include one or more of a RF front end 2, a transceiver component 3, an antenna 4, one or more power amplifiers 5, a control component 6, a computer readable medium 7, a processor 8, a battery 9, and a supply control block 10.

The transceiver component 3 can generate RF signals for transmission via the antenna 4. Furthermore, the transceiver component 3 can receive incoming RF signals from the antenna 4.

It will be understood that various functionalities associated with the transmission and receiving of RF signals can be achieved by one or more components that are collectively represented in FIG. 1B as the transceiver 3. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1B as the antenna 4. For example, a single antenna can be configured to provide both transmitting and receiving functionalities. In another example, transmitting and receiving functionalities can be provided by separate antennas. In yet another example, different bands associated with the wireless device 1 can be provided with different antennas.

In FIG. 1B, one or more output signals from the transceiver 3 are depicted as being provided to the antenna 4 via one or more transmission paths. In the example shown, different transmission paths can represent output paths associated with different bands and/or different power outputs. For instance, the two example power amplifiers 5 shown can represent amplifications associated with different power output configurations (e.g., low power output and high power output), and/or amplifications associated with different bands.

In FIG. 1B, one or more detected signals from the antenna 4 are depicted as being provided to the transceiver 3 via one or more receiving paths. In the example shown, different receiving paths can represent paths associated with different bands. For example, the four example paths shown can represent a quad-band capability supported by some wireless devices.

To facilitate switching between receive and transmit paths, the RF front end 2 can be configured to electrically connect the antenna 4 to a selected transmit or receive path. Thus, the RF front end 2 can provide a number of switching functionalities associated with an operation of the wireless device 1. In certain embodiments, the RF front end 2 can include a number of switches configured to provide functionalities associated with, for example, switching between different bands, switching between different power modes, switching between transmission and receiving modes, or some combination thereof. The RF front end 2 can also be configured to provide additional functionality, including filtering of signals. For example, the RF front end can include one or more duplexers.

The wireless device 1 can include one or more power amplifiers 5. RF power amplifiers can be used to boost the power of a RF signal having a relatively low power. Thereafter, the boosted RF signal can be used for a variety of purposes, included driving the antenna of a transmitter. Power amplifiers 5 can be included in electronic devices, such as mobile phones, to amplify a RF signal for transmission. For example, in mobile phones having an architecture for communicating using the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 1B shows that in certain embodiments, a control component 6 can be provided, and such a component can be configured to provide various control functionalities associated with operations of the RF front end 2, the power amplifiers 5, the supply control 10, and/or other operating component(s). Non-limiting examples of the supply control 10 are described herein in greater detail.

In certain embodiments, a processor 8 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 7 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in the flowchart and/or block diagram block or blocks.

The illustrated wireless device 1 also includes the supply control block 10, which can be used to provide a power supply to one or more of the power amplifiers 5. For example, the supply control block 10 can be a DC-to-DC converter. However, in certain embodiments the supply control block 10 can include other blocks, such as, for example, an envelope tracker configured to vary the supply voltage provided to the power amplifiers 5 based upon an envelope of the RF signal to be amplified.

The supply control block 10 can be electrically connected to the battery 9, and the supply control block 10 can be configured to vary the voltage provided to the power amplifiers 5 based on an output voltage of a DC-DC converter. The battery 9 can be any suitable battery for use in the wireless device 1, including, for example, a lithium-ion battery. By varying the voltage provided to the power amplifiers, the power consumption of the battery 9 can be reduced, thereby improving performance of the wireless device 1.

Overview of Multi-chip Module

Figure 2:
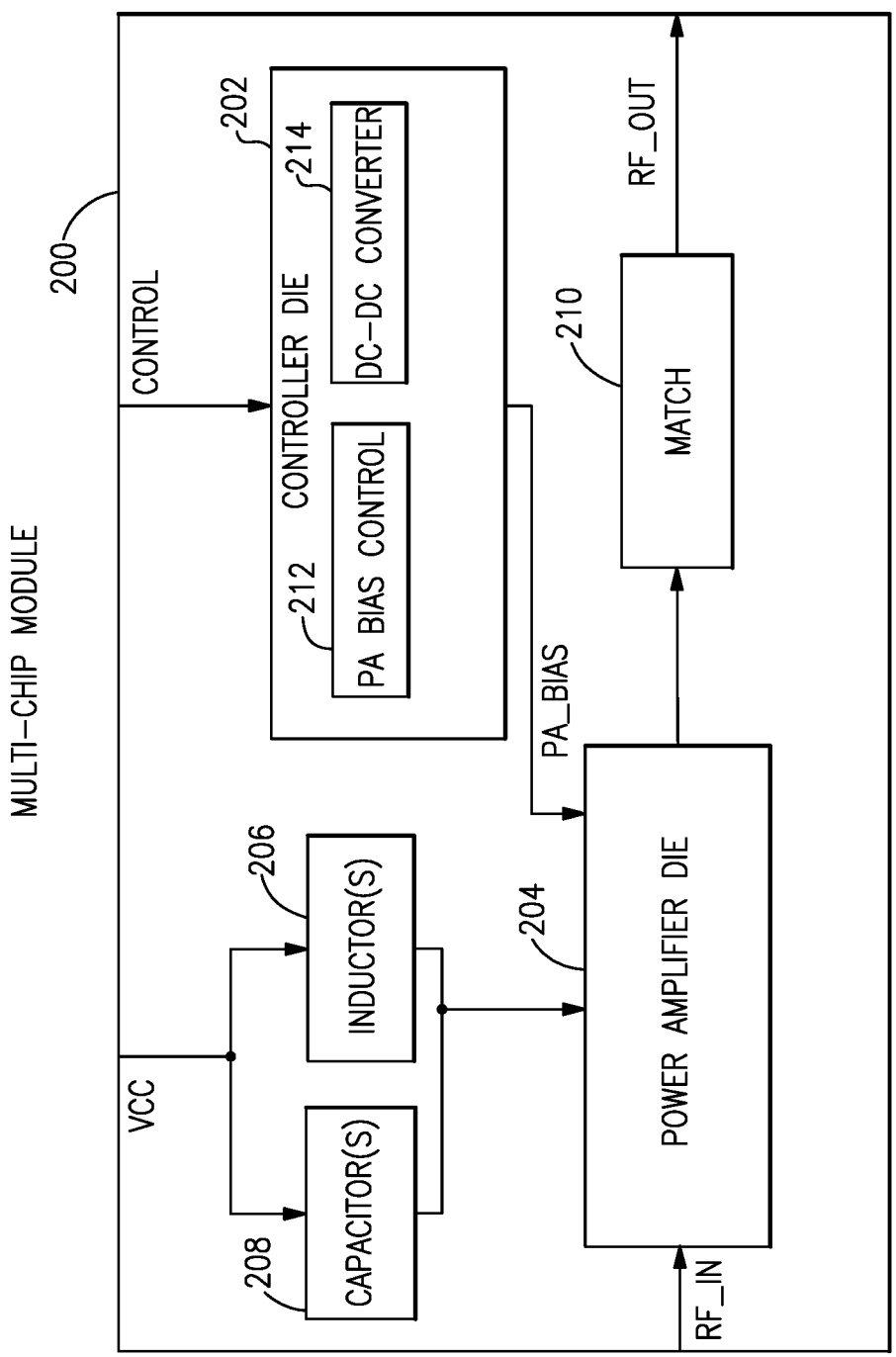
FIG. 2 is a schematic block diagram of an illustrative multi-chip module.

FIG. 2 is a schematic block diagram of a power amplifier module. The illustrated power amplifier module is a multi-chip module (MCM) 200 that can include one or more of a controller die 202, a power amplifier die 204, inductor(s) 206, capacitor(s) 208, and an impedance matching component 210. In some embodiments, the MCM 200 can include one or more of the PAs 5 and elements of the RF front end 2 from the wireless device 1. The multi-chip module 200 can include a plurality of dies and/or other components mounted on a carrier substrate of the module. In some implementations, the substrate can be a multi-layer substrate configured to support the dies and/or components and to provide electrical connectivity to external circuitry when the module is mounted on a circuit board, such as a phone board.

The power amplifier die 204 can receive a RF signal on an input pin $RF_{IN}$ (or RF_IN) of the multi-chip module. The power amplifier die 204 can include one or more power amplifiers 5, including, for example, multi-stage power amplifiers configured to amplify the RF signal. The amplified RF signal can be provided to an output pin $RF_{OUT}$ (or RF_OUT) of the power amplifier module. The impedance matching component 210 can be provided on the power amplifier module to aid in reducing signal reflections and/or other signal distortions. The power amplifier die 204 can be any suitable die. In some implementations, the power amplifier die 204 is a gallium arsenide (GaAs) die. In some of these implementations, the GaAs die has transistors formed using a heterojunction bipolar transistor (HBT) process.

The multi-chip module 200 can also include a $V_{CC}$ pin, which can be electrically connected to a controller. The multi-chip module 200 can include the inductor(s) 206, which can be formed, for example, by traces on the multi-chip module 200. These traces may be formed using a conductive material applied to the circuit board or printed circuit board (PCB). The inductor(s) 206 can operate as a choke inductor, and can be disposed between the supply voltage and the power amplifier die 204. In some implementations, the inductor(s) 206 are surface mounted. Additionally, capacitor(s) 208 can be electrically connected in parallel with the inductor(s) 208 and can be configured to resonate at a frequency near the frequency of a signal received on the pin $RF_{IN}$. In some implementations, the capacitor(s) 208 include a surface mounted capacitor.

In some implementations, the controller die 202 can be manufactured on a silicon wafer. In some of these implementations, the controller die 202 can be manufactured using complementary metal oxide semiconductor (CMOS) process technology. The controller die 202 can include a power amplifier bias control block 212 and/or a DC-DC converter block 214. The power amplifier bias control block 212 can be used, for example, to provide bias signals to the power amplifier die 204. For example, in a bipolar transistor power amplifier configuration, the controller die 202 can be used to provide a reference voltage for biasing a current mirror used to generate a base current for the power amplifiers 5, such as a base current for a bipolar transistor. The controller die 202 can also be used to enable and/or disable a power amplifier 5 disposed on the power amplifier die 204, which can aid in selectively activating a power amplifier 5 associated with a particular transmission path. For example, the controller die 202 can receive a control signal on a pin CONTROL, and can use the control signal to vary the bias signal provided to the power amplifier die 204 so as to selectively enable or disable the power amplifier 5. The controller die 202 can also include a DC-DC converter 214, as will be described in more detail herein.

The multi-chip module 200 can be modified to include more or fewer components, including, for example, additional power amplifier dies, capacitors and/or inductors. For instance, the multi-chip module 200 can include an additional power amplifier die, as well as an additional capacitor and inductor configured to operate as a parallel LC circuit disposed between the additional power amplifier die and the $V_{CC}$ pin of the module. The multi-chip module 200 can be configured to have additional pins, such as in implementations in which a separate power supply is provided to an input stage disposed on the power amplifier die 204 and/or implementations in which the multi-chip module 200 operates over a plurality of bands.

DC-DC Voltage Conversion

Figure 3A:
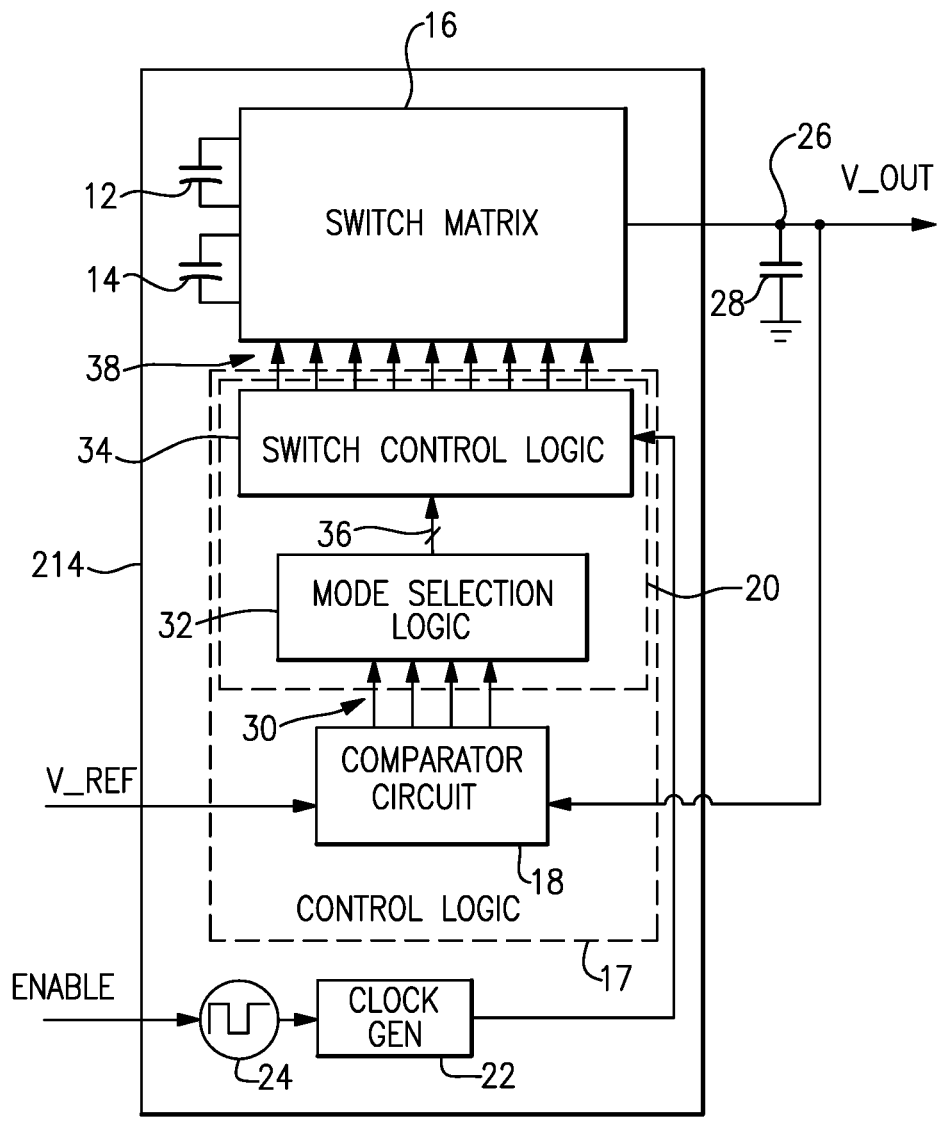
FIGS. 3A and 3B are schematic block diagrams of voltage converters according to certain embodiments.

As illustrated in FIG. 3A, in an illustrative embodiment, a DC-DC voltage converter 214 can include two capacitors 12 and 14, a switch matrix 16, and control logic 17. The control logic 17 can include any suitable circuit elements configured to adjust states of the switch matrix 16. The control logic 17 can include a comparator circuit 18 and switching logic 20. A reference voltage signal V_REF can be provided to the DC-DC voltage converter 214 as a control input. In certain embodiments, the reference voltage signal V_REF can be generated by a digital-to-analog converter (DAC) that is external to the DC-DC converter 214. Such a DAC can control an output of the DC-DC converter 214 for continuous power amplifier power adjustment. According to some embodiments, the reference voltage V_REF can be bypassed by a relatively large capacitor (for example, having a capacitance on the order of 1000 pF) to analog ground. Such a bypass capacitor can have a first end electrically coupled to the reference voltage V_REF provided to an input to the DC-DC converter 214, and the bypass capacitor can have a second end coupled to analog ground. As a result, the reference voltage V_REF can be a relatively noise-free signal. The DC-DC voltage converter 214 can produce an output voltage signal V_OUT that can correspond to and/or track the reference voltage signal V_REF. In some implementations, the output voltage signal V_OUT can be provided to a collector of a bipolar transistor in a power amplifier 5. The DC-DC voltage converter 214 can further include a clock signal generator circuit 22 and associated oscillator 24 that can be activated by an enable signal, ENABLE. The enable signal can remain active during the operation of the DC-DC voltage converter 214.

The switch matrix 16 is configurable into one of several mode configurations, for example, as described below, in which the capacitors 12 and 14 are interconnected in different configurations. Each mode configuration can be referred to as a state of the switch matrix 16. In each mode configuration, switch matrix 16 can assume either a first phase configuration, in which the capacitor circuit including the interconnected capacitors 12 and 14 is charging, or a second phase configuration, in which the capacitor circuit including the interconnected capacitors 12 and 14 is discharging. The switch matrix 16 can provide the output of the capacitor circuit at an output node 26. In operation, the switch matrix 16 can alternately switch between the first and second phase configurations in response to the clock signal generated by the clock signal generator 22. Filter circuitry, such as a capacitor 28, can be connected to output node 26 to filter the output voltage signal V_OUT.

As described in further detail below, comparator circuit 18 can compare the reference voltage signal V_REF with one or more other reference signals generated by a power supply that can be independent of the reference voltage signal V_REF. In response to one or more of these comparisons, the comparator circuit 18 can generate a number of comparison signals 30. The switching logic 20 can include mode selection logic 32 and switch control logic 34. The mode selection logic 32 can receive the comparison signals 30 and, in response, generate one or more mode selection signals 36. The switch control logic 34 can receive mode selection signals 36 and, in response, generate one or more switch control signals 38.

Figure 3B:
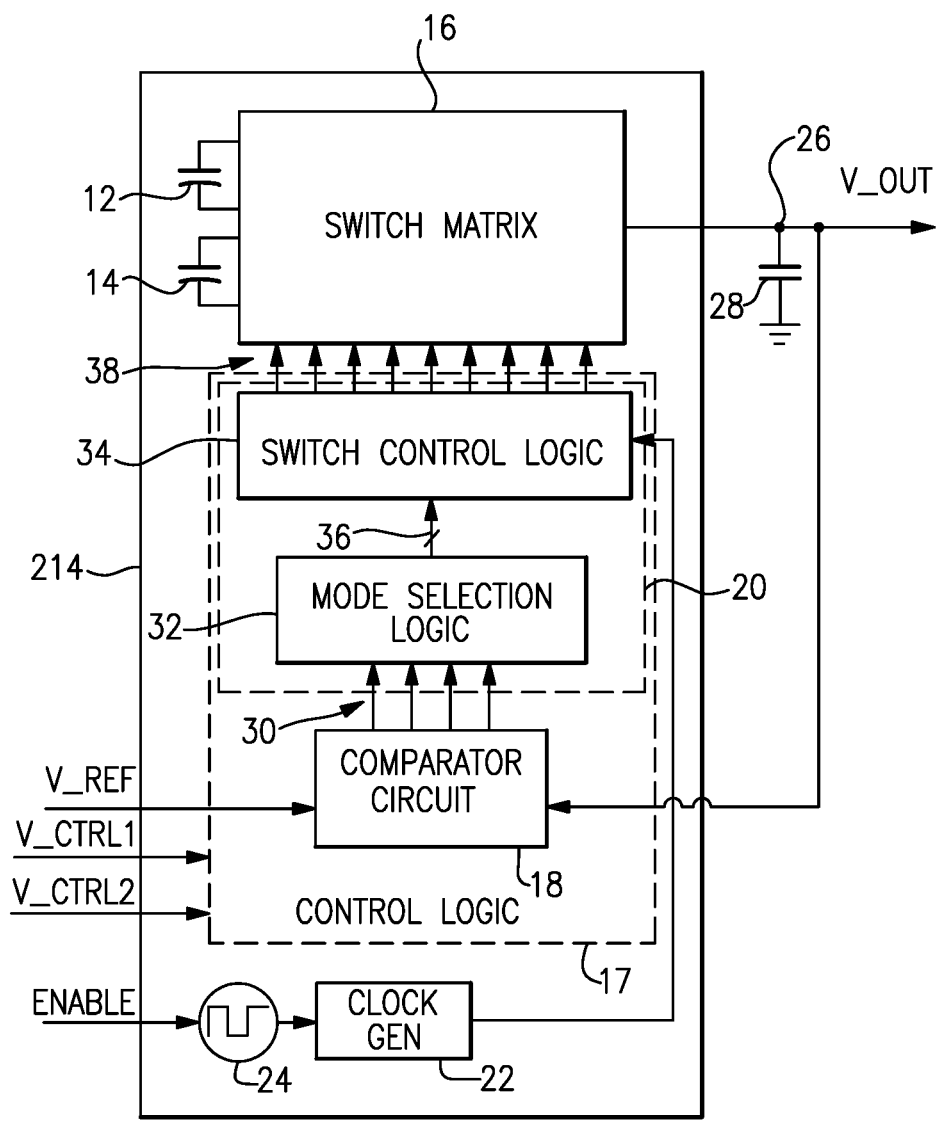

FIG. 3B shows another illustrative DC-DC converter 214. The DC-DC converter of FIG. 3B is substantially the same as the DC-DC converter of FIG. 3A, except that the DC-DC converter of FIG. 3B receives additional input signal(s) that can be used to program the DC-DC converter of FIG. 3B to operate in either step mode(s) or continuous mode(s). Thus, the DC-DC converter of FIG. 3B can be programmable between step modes and continuous mode. For example, providing one or more control signals, such as V_CTRL1 and/or V_CTRL2, to the control logic 17, can generate an output voltage V_OUT that can either be a continuous output voltage or one of a plurality of discrete output voltages. More specifically, with two digital bits V_CTRL1, V_CTRL2 and a reference voltage V_REF, the DC-DC converter 214 can either produce the continuous output or use two control bits control V_CTRL1, V_CTRL2 to generate 4 discrete output voltages. The control bits V_CTRL1, V_CTRL2 can be baseband inputs. The control bits can drive an analog signal, or two or more digital signals. The control bits can, for example, clock gate circuitry related to the reference voltage V_REF. In some implementations, the DC-DC converter 214 may be able to generate both continuous and discrete voltages concurrently.

As illustrated in FIGS. 4A, 4B, 5A, 5B, 6A, 6B, 7A and 7B, the switch matrix 16 can interconnect capacitors 12 and 14 in several different configurations between a voltage potential (e.g., either a supply voltage, such as the battery voltage, or ground) and the output node 26. The illustrative switch matrix 16 includes nine switches 40, 42, 44, 46, 48, 50, 52, 54 and 56, which are controlled by the switch control signals 38 (S1-S9). Although switches 40-56 are shown schematically in FIGS. 4A-7B in the form of controllable, single-pole, single-throw (SPST) switches, they can include any suitable switching devices, such as field-effect transistors (FETs). For example, in some implementations, each of switches 40 and 50 can include a P-type FET (PFET), each of switches 46 and 56 can include an N-type FET (NFET), and each of switches 42, 44, 48, 52 and 54 can include a parallel combination of a PFET and an NFET. The control terminal (e.g., gate) of each FET can receive one of the switch control signals 38 (S1-S9).

Although the switch matrix 16 includes nine switches in the example embodiment, which can be arranged as shown, in other embodiments, a switch matrix can include any suitable number of switches arranged in any other suitable manner. Similarly, although the illustrative embodiment includes two capacitors 12 and 14, which the switch matrix 16 can interconnect as described below, other embodiments can include more than two capacitors, and a switch matrix can interconnect the capacitors in a variety of suitable configurations. Furthermore, applying the principles and advantages described herein, any suitable number of modes can be implemented using a switch matrix. In addition, although a battery voltage is described, another power supply voltage can be in combination with a battery or as an alternative.

Figure 4A:
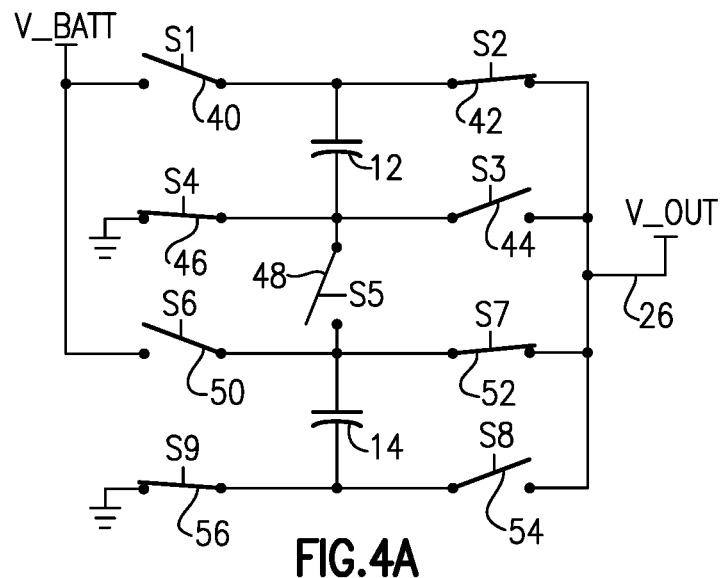
FIG. 4A is a circuit diagram illustrating an example switch matrix of FIG. 3A and FIG. 3B in a first phase configuration of a first mode configuration.
Figure 4B:
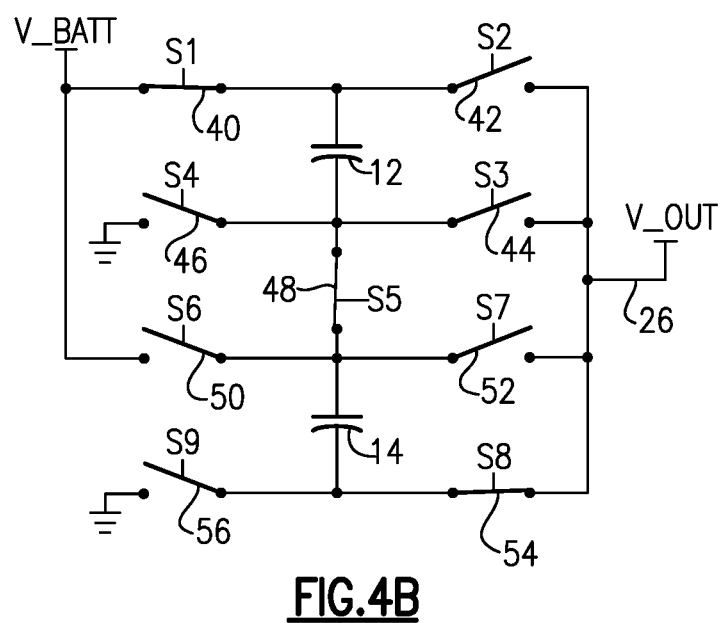
FIG. 4B is a circuit diagram illustrating the example switch matrix of FIG. 3A and FIG. 3B in a second phase configuration of the first mode configuration.

As illustrated in FIGS. 4A-B, in a first configuration, the switch matrix 16 can interconnect the capacitors 12 and 14 in either the first phase configuration shown in FIG. 4A or the second phase configuration shown in FIG. 4B. This first configuration can be referred to herein as the "1/3 mode" because operation in this mode is intended to result in an output voltage signal V_OUT at output node 26 having a voltage level that is nominally or on average about one-third of the battery voltage V_BATT, according to some implementations.

As shown in FIG. 4A, in the first phase configuration of the 1/3 mode, the switches 40, 44, 48, 50 and 54 are open, and the switches 42, 46, 52 and 56 are closed. The combination of the closed states of switches 42 and 46 couples, or electrically connects, capacitor 12 between a ground voltage potential (e.g., 0 volts) and the output node 26. The combination of the closed states of switches 52 and 56 similarly couples, or electrically connects, capacitor 14 between the ground potential and output node 26 (i.e., in parallel with capacitor 12). Thus, in the first phase configuration of the 1/3 mode, the capacitor circuit including capacitors 12 and 14 in parallel with each other discharges with respect to output node 26.

As shown in FIG. 4B, in the second phase configuration of the 1/3 mode, the switches 42, 44, 46, 50, 52 and 56 are open, and the switches 40, 48 and 54 are closed. The combination of the closed states of switches 40, 48 and 54 couples capacitors 12 and 14 in series between a positive voltage potential, such as a base reference voltage provided by a battery V_BATT or other voltage supply, and output node 26. Thus, in the second phase configuration of the 1/3 mode, the capacitor circuit including capacitors 12 and 14 in series with each other charges with respect to output node 26.

Figure 5A:
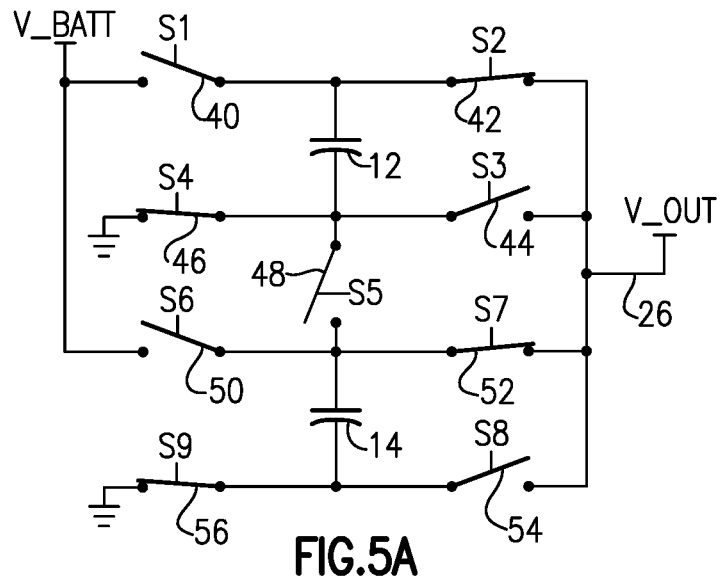
FIG. 5A is a circuit diagram illustrating the example switch matrix of FIG. 3A and FIG. 3B in a first phase configuration of a second mode configuration.
Figure 5B:
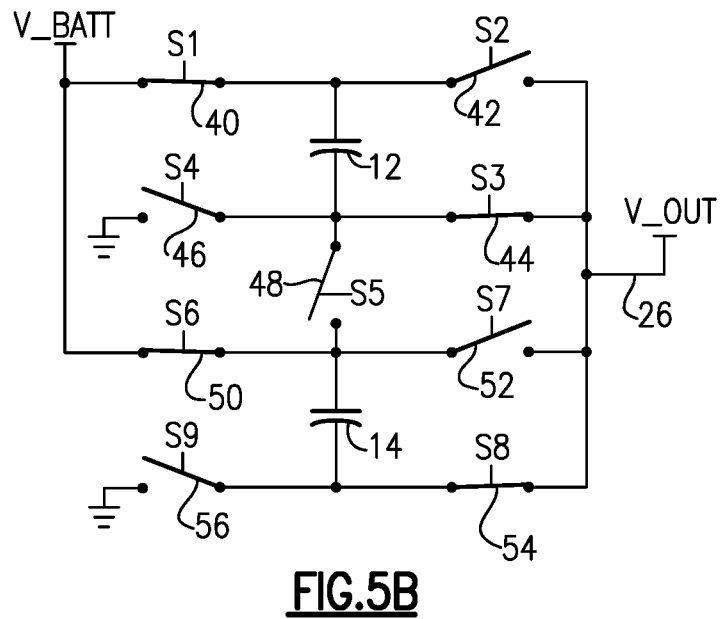
FIG. 5B is a circuit diagram illustrating the example switch matrix of FIG. 3A and FIG. 3B in a second phase configuration of the second mode configuration.

As illustrated in FIGS. 5A-B, in a second configuration, the switch matrix 16 can interconnect capacitors 12 and 14 in either the first phase configuration shown in FIG. 5A or the second phase configuration shown in FIG. 5B. This second configuration can be referred to herein as the "1/2A mode" because operation in this mode is intended to result in an output voltage signal V_OUT at output node 26 having a voltage level that is nominally or on average about one-half of the battery voltage V_BATT, according to some implementations. Also, as described below, there is a variant of the 1/2A mode, referred to as the 1/2B mode.

As shown in FIG. 5A, in the first phase configuration of the 1/2A mode, the switches 40, 44, 48, 50 and 54 are open, and the switches 42, 46, 52 and 56 are closed. The combination of the closed states of switches 42 and 46 couples capacitor 12 between ground and output node 26. The combination of the closed states of switches 52 and 56 similarly couples capacitor 14 between ground and output node 26 (i.e., in parallel with capacitor 12). Thus, in the first phase configuration of the 1/2A mode, the capacitor circuit including capacitors 12 and 14 in parallel discharges with respect to output node 26.

As shown in FIG. 5B, in the second phase configuration of the 1/2A mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the second phase configuration of the 1/2A mode, the capacitor circuit including capacitors 12 and 14 in parallel with each other charges with respect to output node 26.

Figure 6A:
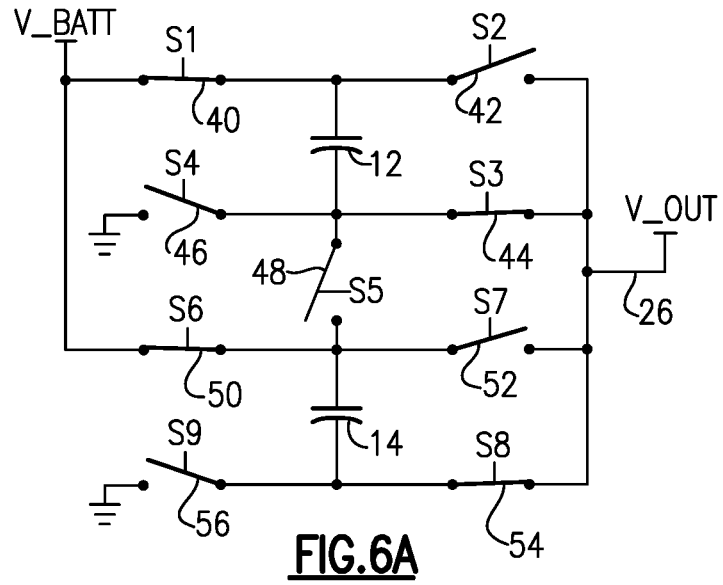
FIG. 6A is a circuit diagram illustrating the example switch matrix of FIG. 3A and FIG. 3B in a first phase configuration of a variant of the second mode configuration.
Figure 6B:
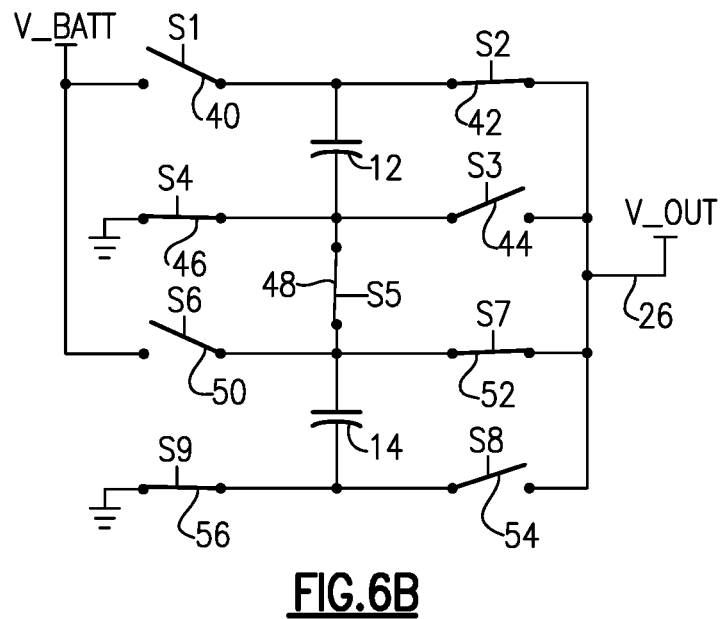
FIG. 6B is a circuit diagram illustrating the example switch matrix of FIG. 3A and FIG. 3B in a second phase configuration of the variant of the second mode configuration.

The 1/2B mode variant of the second mode configuration is shown in FIGS. 6A-B. The second mode configuration includes both the 1/2A and 1/2B modes, or sub-modes, to minimize the number of switches that change state during switching from one mode to another, as described below. Although these sub-modes are included in the illustrative embodiment, in other embodiments such sub-modes need not be included.

As shown in FIG. 6A, in the first phase configuration of the 1/2B mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the second phase configuration of the 1/2B mode, the capacitor circuit including capacitors 12 and 14 in parallel charge with respect to output node 26.

As shown in FIG. 6B, in the second phase configuration of the 1/2B mode, the switches 40, 44, 48, 50 and 54 are open, and the switches 42, 46, 52 and 56 are closed. The combination of the closed states of switches 42 and 46 couples capacitor 12 between ground and output node 26. The combination of the closed states of switches 52 and 56 similarly couples capacitor 14 between ground and output node 26 (i.e., in parallel with capacitor 12). Thus, in the second phase configuration of the 1/2B mode, the capacitor circuit including capacitors 12 and 14 in parallel with each other discharges with respect to output node 26.

Figure 7A:
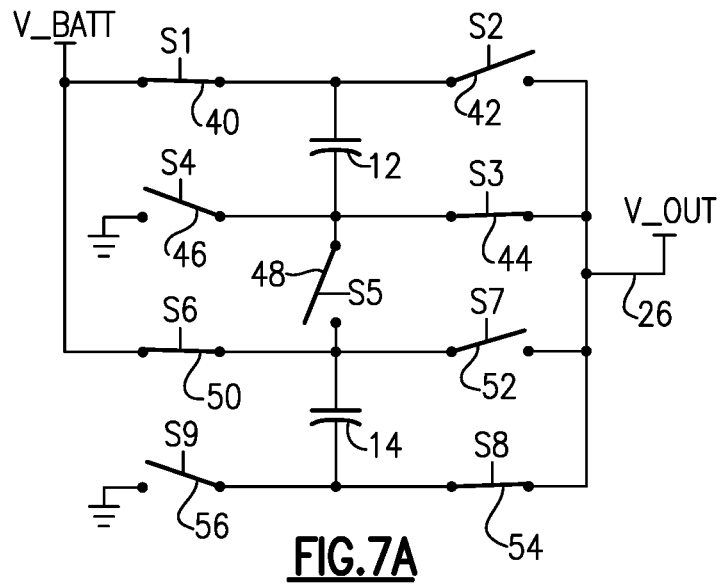
FIG. 7A is a circuit diagram illustrating the example switch matrix of FIG. 3A and FIG. 3B in a first phase configuration of a third mode configuration.
Figure 7B:
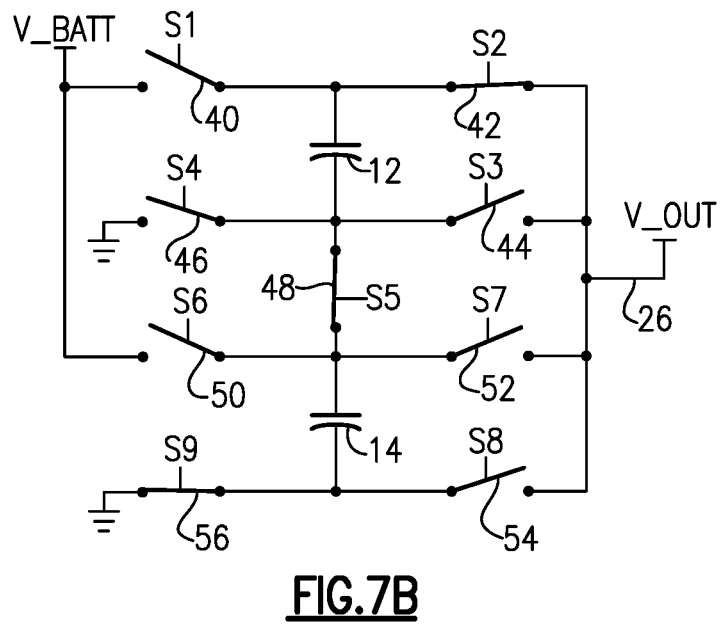
FIG. 7B is a circuit diagram illustrating the example switch matrix of FIG. 3A and FIG. 3B in a second phase configuration of the third mode configuration.

As illustrated in FIGS. 7A-B, in a third configuration, the switch matrix 16 can interconnect capacitors 12 and 14 in either the first phase configuration shown in FIG. 5A or the second phase configuration shown in FIG. 5B. This third configuration can be referred to herein as the "2/3 mode" because operation in this mode is intended to result in an output voltage signal at output node 26 having a voltage level that is nominally about two-thirds of the battery voltage V_BATT, according to some implementations.

As shown in FIG. 7A, in the first phase configuration of the 2/3 mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the first phase configuration of the 2/3 mode, the capacitor circuit including capacitors 12 and 14 in parallel with each other charges with respect to output node 26.

As shown in FIG. 7B, in the second phase configuration of the 2/3 mode, the switches 40, 44, 46, 50, 52 and 54 are open, and the switches 42, 48 and 56 are closed. The combination of the closed states of switches 42, 48 and 56 couples capacitors 12 and 14 in series between ground and output node 26. Thus, in the second phase configuration of the 2/3 mode, the capacitor circuit including capacitors 12 and 14 in series with each other discharges with respect to output node 26.

Figure 8A:
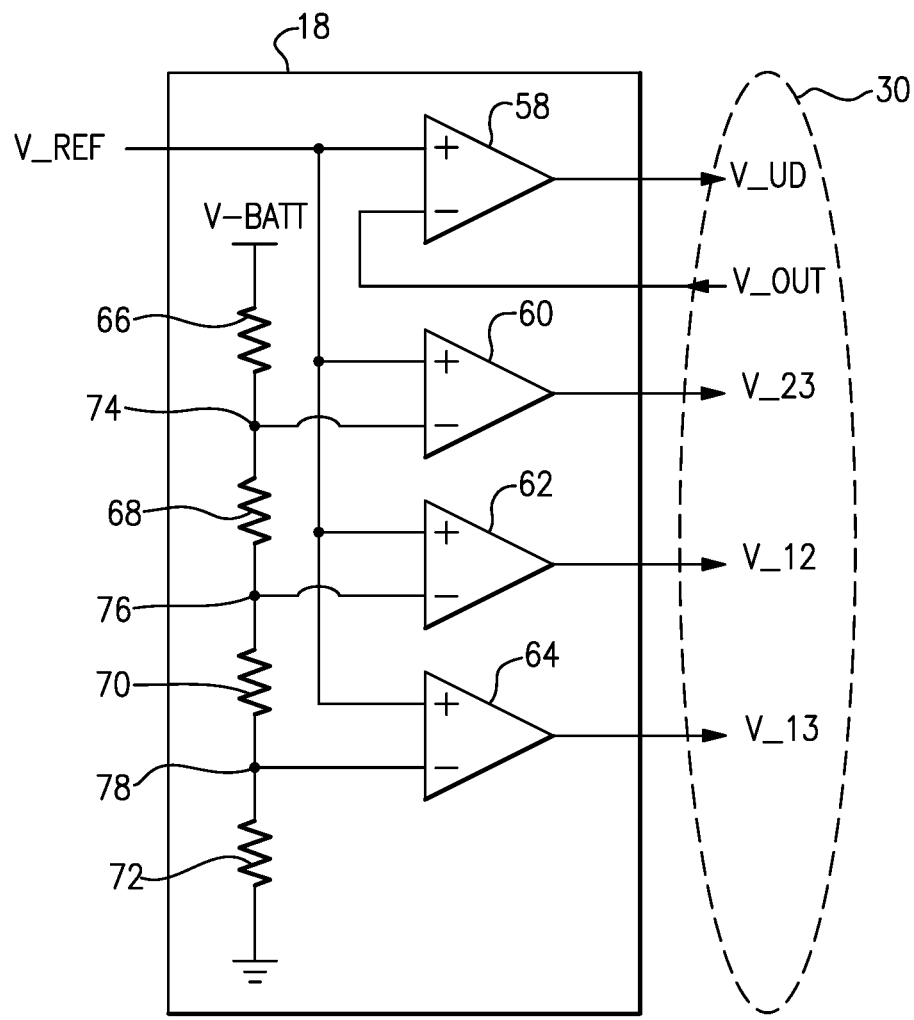
FIG. 8A is a circuit diagram of an example comparator circuit of FIG. 3A and FIG. 3B.

As illustrated in FIG. 8A, the comparator circuit 18 can include four comparators 58, 60, 62 and 64 and a voltage level generator including four resistors 66, 68, 70 and 72. The resistors 66, 68, 70, and 72 can be connected in series with each other between a supply voltage, such as the battery voltage, and ground. The values of resistors 66, 68, 70, and 72 can be selected such that the voltage at a node 74 at a first input of comparator 60 (e.g., the inverting input) is approximately 2/3 of the supply voltage V_BATT, the voltage at a node 76 at a first input of comparator 62 is approximately 1/2 of supply voltage V_BATT, and the voltage at a node 78 at a first input of comparator 64 is approximately 1/3 of supply voltage V_BATT. The second input (e.g., the non-inverting input) of each of comparators 60, 62 and 64 can be coupled to the reference voltage signal V_REF. In other implementations, the voltage level generator can generate any suitable voltage levels, for example, via a resistive voltage divider.

The reference voltage signal V_REF can be an analog baseband signal. In some instances, the reference voltage signal V_REF can track an output power of a power amplifier, such as the power amplifiers 5 described earlier. The reference voltage signal V_REF can be independent of a power supply signal, such as the battery voltage V_BATT. The reference voltage signal V_REF can be a clean signal with relatively little noise. For instance, in some implementations, noise features can distort the reference voltage signal V_REF by no more than about 0.01% to 0.5% of the magnitude of the reference voltage signal V_REF. In some implementations, noise features can distort the reference voltage signal V_REF by no more than about 0.05% of the magnitude of the reference voltage signal V_REF, no more than about 0.1% of the magnitude of the reference voltage signal V_REF, no more than about 0.25% of the magnitude of the reference voltage signal V_REF, or no more than about 0.5% of the magnitude of the reference voltage signal V_REF. In some embodiments, a bypass capacitor (for example, as described earlier) can reduce noise and/or maintain a low level of noise on the reference voltage signal V_REF. Using the reference voltage signal V_REF can avoid situations in which the mode can get trapped due to jitter associated with a signal provided to a comparator. The output voltage V_OUT can charge with the battery voltage V_BATT while the reference voltage signal V_REF is independent of the battery voltage V_BATT. Moreover, basing a comparison of the comparator circuit 18 on the reference voltage signal V_REF can increase the speed at which the output voltage V_OUT is charged up. In various implementations, the reference voltage signal V_REF can be filtered prior to being provided to the input of any combination of the comparators 58, 60, 62, and 64.

The output V_23 of the comparator 60 being high can indicate that the reference voltage V_REF exceeds (e.g., is greater in magnitude than) 2/3 V_BATT; the output V_12 of the comparator 62 being high can indicate that the reference voltage V_REF exceeds 1/2 V_BATT; and the output V_13 of the comparator 64 being high can indicate that the reference voltage V_REF exceeds 1/3 V_BATT. One input of comparator 58 (e.g., the inverting input) can be connected to the output voltage signal V_OUT at the output node 26. However, the other input of the comparator 58 (e.g., the non-inverting input) can be connected to the reference voltage signal V_REF. Thus, the output V_UD (or $V_{UD}$) of the comparator 58 being high can indicate that the reference voltage V_REF exceeds the output voltage V_OUT. Conversely, the output V_UD of comparator 58 being low can indicate that the output voltage V_OUT exceeds the reference voltage V_REF. In some implementations, the output V_UD of the comparator 58 can serve as a direction comparison signal, indicating to switching logic 20 (FIGS. 3A and/or 3B) in which direction, "up" or "down," switching logic 20 should cause the output voltage signal V_OUT to change.

The outputs of one or more of the comparators 58, 60, 62, 64 can be provided to a switch matrix, such as the switch matrix 16 described earlier. In some implementations, the outputs of the comparators may be provided to the switch matrix 16 via one or more intervening circuit elements.

Figure 8B:
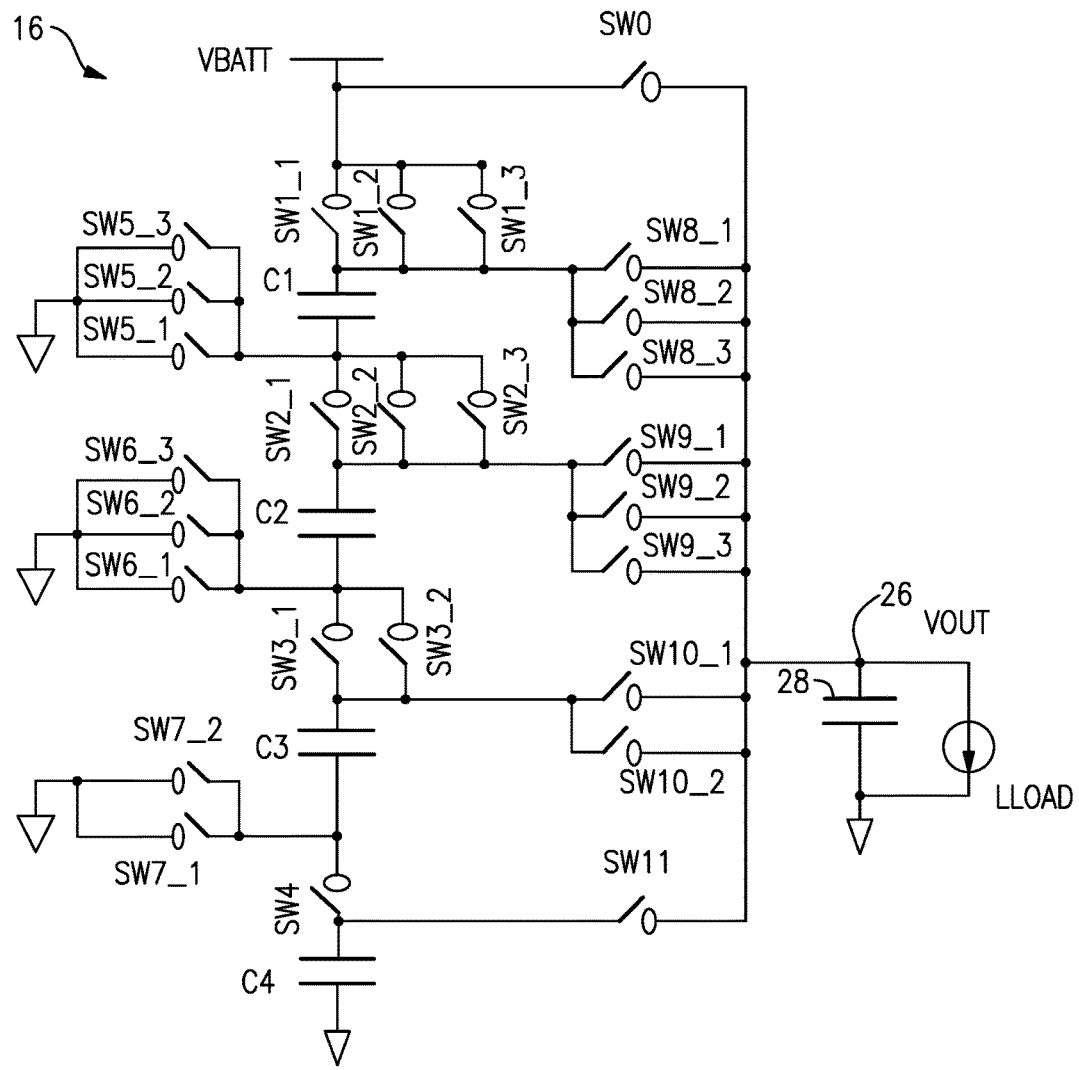
FIG. 8B shows another example switch matrix in combination with capacitive circuit elements.

Another example switch matrix in combination with capacitive circuit elements is shown in FIG. 8B. The switch matrix 16 illustrated in FIG. 8B can implement any combination of features of the switch matrices described herein. As shown in FIG. 8B, switches in a switch matrix 16 can be represented by two or more sub-switches in parallel and/or in series with each other. Each sub-switch can include a voltage controlled switch, for example, an NFET and/or a PFET device. The switch matrix 16 can be implemented with more than two capacitive circuit elements, such as capacitors. For instance, as illustrated in FIG. 8B, the switch matrix 16 can be implemented with four capacitors C1, C2, C3, and C4. The capacitors C1, C2, C3, and C4 can have approximately the same capacitance in some implementations. According to other implementations, two or more of the capacitors C1, C2, C3, and C4 can have different capacitances. One or more of the capacitors C1, C2, C3, and C4 can have a different capacitance than the capacitor 28.

In some implementations, one or more switches in the switch matrix can be implemented by a plurality of sub-switches in parallel. Each of the plurality of sub-switches can be controlled by a different input signal. For example, sub-switch sw1_1 can be controlled by output V_23 of the comparator 60, sub-switch sw1_2 can be controlled by the output V_12 of the comparator 62, and sub-switch sw1_3 can be controlled by the output V_13 of the comparator 64. As another example, sub-switch sw3_1 and sub-switch sw3_2 can be controlled by two different signals selected from V_23, V_12, and V_13. The switch sw4 can be considered to have only one sub-switch, which can be controlled by V_13, V_12, or V_23. As also illustrated in FIG. 8B, some switches can include different numbers of sub-switches (e.g., one, two, or three sub-switches as illustrated) based on design considerations. While four comparators are shown in FIG. 8A, any suitable number of comparators can be included in order to achieve a desired level of granularity to control the switch matrix 16. For example, more comparators can be added to the comparator circuit 18 to generate additional control signals to achieve finer resolution for switch control over the range of voltage levels of the reference voltage signal V_REF. In some of these implementations, more than three sub-switches that are controlled by different control signals generated by the comparator circuit 18 may be provided for one or more switches of the switch matrix 16.

With the voltage level of the reference voltage signal V_REF changing, the output voltages of the comparators (e.g., V_23, V_12, and V_13) can be used to dynamically adjust the effective switch size of switches in the switch matrix 16 to improve and/or optimize efficiency at different voltage levels of the reference voltage signal V_REF. For example, at a relatively high voltage level (e.g., above 2/3 Vbatt, assuming a 1 to 1 ratio between V_REF and V_OUT) of the reference voltage signal V_REF, all sub-switches in parallel can be turned on to lower the resistance of the switches in an on state. As another example, at a relatively low voltage level (e.g., below 1/3 Vbatt, assuming a 1 to 1 ratio between V_REF and V_OUT) of the reference voltage signal V_REF, only a portion of the sub-switches in parallel with each other can be turned on to reduce dynamic switching current. Thus, an effective size of a switch, such as a field effect transistor, in the switch matrix 16 can be adjusted based on current needed. As a result, less current can be consumed dynamically charging one or more capacitors, such as capacitors 12 and/or 14.

Switching frequency can also be controlled based on one or more outputs of the comparators 58, 60, 62, and 64. The effective resistance of the switched capacitor network can be proportional to the reciprocal of switching frequency multiplied by capacitance. More sub-switches in parallel can reduce the effective resistance and fewer sub-switches in parallel can increase effective resistance of the switched capacitor network. Since dynamic power can be proportional to capacitance multiplied by voltage squared multiplied by frequency, adjusting the switching frequency can reduce power and/or enable selection of a switching frequency for efficiency with a particular voltage level of the reference voltage signal V_REF. This can achieve better efficiency for specific voltage levels of the reference voltage signal V_REF.

Figure 8C:
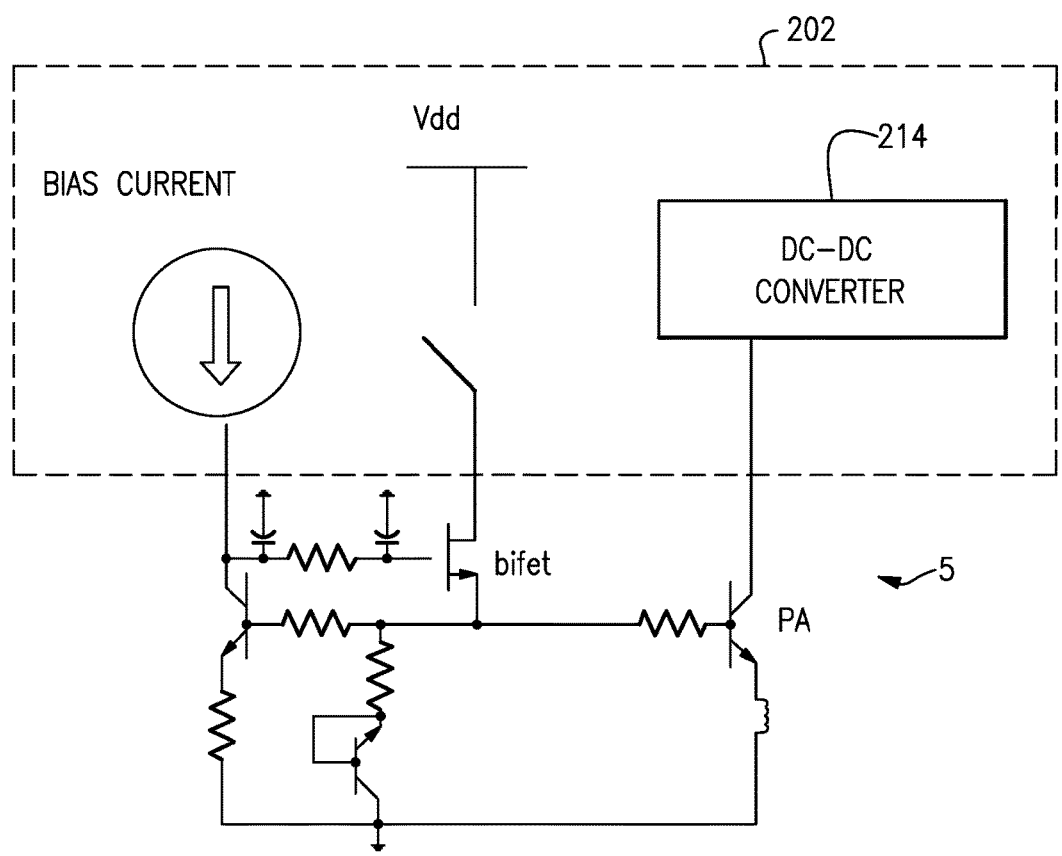
FIG. 8C illustrates an example schematic of a bias control circuit for a power amplifier.

FIG. 8C illustrates an example schematic of a bias control circuit for a power amplifier 5. The DC-DC voltage converter 214 of FIG. 8C can include any combination of features of the voltage converters described herein, such as the DC-DC voltage converter 10. One or more of the outputs from the comparator circuit 18, such as the comparators 60, 62, 64 of FIG. 8A, can be used to dynamically adjust bias current for a power amplifier 5 based on a voltage level of the reference voltage signal V_REF. Any suitable number of comparators can be included in the comparator circuit 18 of the control logic in order to achieve a desired level of resolution to control bias current of the power amplifier. For instance, more comparators can be included in the comparator circuit 18 to achieve finer resolution for the power amplifier bias control over the range of voltage levels of the reference voltage signal V_REF. This can further improve the power amplifier efficiency with adjacent channel power ratio (ACPR) margin. In some implementations, the bias current profile of the power amplifier 5 can track the voltage reference signal and/or the power amplifier power output level continuously, as well as the collector voltage of the power amplifier 5.

In some implementations, the mode selection logic 32 of the switching logic 20 (FIGS. 3A and/or 3B) can include combinational logic configured to determine the mode to which the switching logic 20 causes the switch matrix 16 to switch in order to cause the output voltage signal V_OUT to change in the direction indicated by the direction comparison signal, which can be generated by, for example, the comparator 58. The mode selection logic 32 can receive the comparison signals 30, which can be the outputs of the comparator circuit 18 (for example, outputs of the comparators 58-64) and/or based on the outputs of comparator circuit 18 (for example, based on outputs of the comparators 58-64). The comparison signals 30 can be provided as inputs to the combinational logic. The combinational logic can be provided in any suitable form, such as a network of logic gates. For illustrative purposes, the combinational logic will be described herein with reference to the table 80 shown in FIG. 9A. It will be understood that there are a number of ways to implement the logic functions represented by the table 80 with a network of logic gates or any other suitable form. The mode selection logic 32 can output mode selection signals 36 (FIGS. 3A and/or 3B) in response to the comparison signals 30 and the combinational logic.

As illustrated in FIG. 9A, Table 80 indicates the "next mode" (which can also be referred to as a "next state") to which switching logic 20 can cause the switch matrix 16 to switch in response to a combination of the outputs V_UD, V_23, V_12 and V_13 of comparators 58, 60, 62, and 64, respectively. The modes indicated in table 80 are described above: the 1/3 mode, the 1/2A mode, the 1/2B mode, and the 2/3 mode. Table 80 also indicates whether to "hold" the current mode, i.e., to maintain the current mode as the next mode. Specifically, the outputs of all of comparators 58-64 being low can indicate that the current mode is to be held in the (second phase configuration of the) 1/3 mode. In other instances, table 80 indicates that the mode is to switch. As described below, the mode can switch from the current mode to the next mode on every other clock cycle. It should be noted that a reference herein to "switching" or "changing" modes or to providing a mode control signal is intended to encompass within its scope of meaning not only changing to a different mode but also to maintaining the same mode at the time during which mode switching can occur, i.e., switching or changing from the current mode to the "next" mode in an instance in which both the current mode and next mode are the same.

The mode selection logic 32 (FIGS. 3A and/or 3B) can include encoding logic to encode some or all of the output, e.g., the next mode, and provide mode selection signals 36 in an encoded form. The encoding logic can encode the output in the form of, for example, a 3-bit word (MODE[2: 0]). For example, the next mode output "1/3" can be encoded as "001"; the next mode output "1/2A" can be encoded as "010"; the next mode output "1/2B" can be encoded as "011"; and the next mode output "2/3" can be encoded as "100". As providing such encoding logic is well within the capabilities of persons skilled in the art, it is not shown or described in further detail herein.

FIG. 9B is an example signal graph 900 illustrating the application of the example mode selection logic reflected in the truth table of FIG. 9A. The line 902 represents the output voltage, V_OUT, of the DC-DC voltage converter in the line 904 represents the reference voltage, V_REF, supplied to the DC-DC voltage converter. Further, the line 906 represents the voltage supplied by the voltage supply, V_BATT. The lines 908, 910, and 912 illustrate the points on the graph 900 corresponding to 1/3, 1/2, and 2/3 of the supply voltage, respectively. In the example illustrated in FIG. 9B, the reference voltage is a step function that begins slightly below 2/3 V_BATT and drops down to slightly above 1/3 V_BATT after a period of time. It should be noted that although the example reference voltage is illustrated as a step function, the reference voltage is not limited as such and a variety of types of functions may be used to represent the reference voltage.

As illustrated by the line 914, the signal V_UD corresponding to the comparison between the output voltage of the converter and the reference voltage may have a '1' value or logically high-value when V_OUT, or the output voltage, is less than V_REF or the reference voltage. When the output voltage exceeds the reference voltage, the V_UD value drops to '0' or a logic low value. It should be understood that whether the V_UD value is a '0' or a '1' when the output voltage is greater than the reference voltage is a matter of convention and is not limited to the values specified in the described examples herein. Similarly, the values of the additional comparators described herein are also not limited to the example values presented.

In some implementations, the V_UD signal changes value only at a particular point within a clock signal, such as the leading or rising edge of a clock signal. However, in other implementations, as illustrated by V_UD line 914 and the clock line 916 representing the clock signal, the V_UD value may change instantaneously upon a change in the relationship between the output voltage and the reference voltage regardless of the clock signal.

As discussed above, the next mode to which the switching logic 20 can cause the switch matrix 16 to switch can occur in response to a combination of the outputs V_UD, V_23, V_12 and V_13 of comparators 58, 60, 62, and 64, respectively. Further, as stated above, the line 914 reflects the value for the output V_UD, which correlates to whether the output voltage V_OUT exceeds the desired voltage, or the reference voltage. Similarly, the lines 918, 920, and 922 reflect the outputs of V_13, V_12, and V_23, respectively. As seen from the graph 900, when the output voltage exceeds 1/3 V_BATT, the line 918 moves from logically low to logically high. Similarly, when the output voltage exceeds 1/2 V_BATT, the line 920 moves from logically low to logically high. Further, when the reference voltage is reduced to less than 1/2 V_BATT causing the output voltage to fall below 1/2 V_BATT, the output of the comparator V_12 moves from logically high back to logically low. The line 922 remains logically low in the example illustrated in FIG. 9B as the reference voltage does not reach 2/3 V_BATT and thus the output voltage does not reach 2/3 V_BATT.

Figure 10:
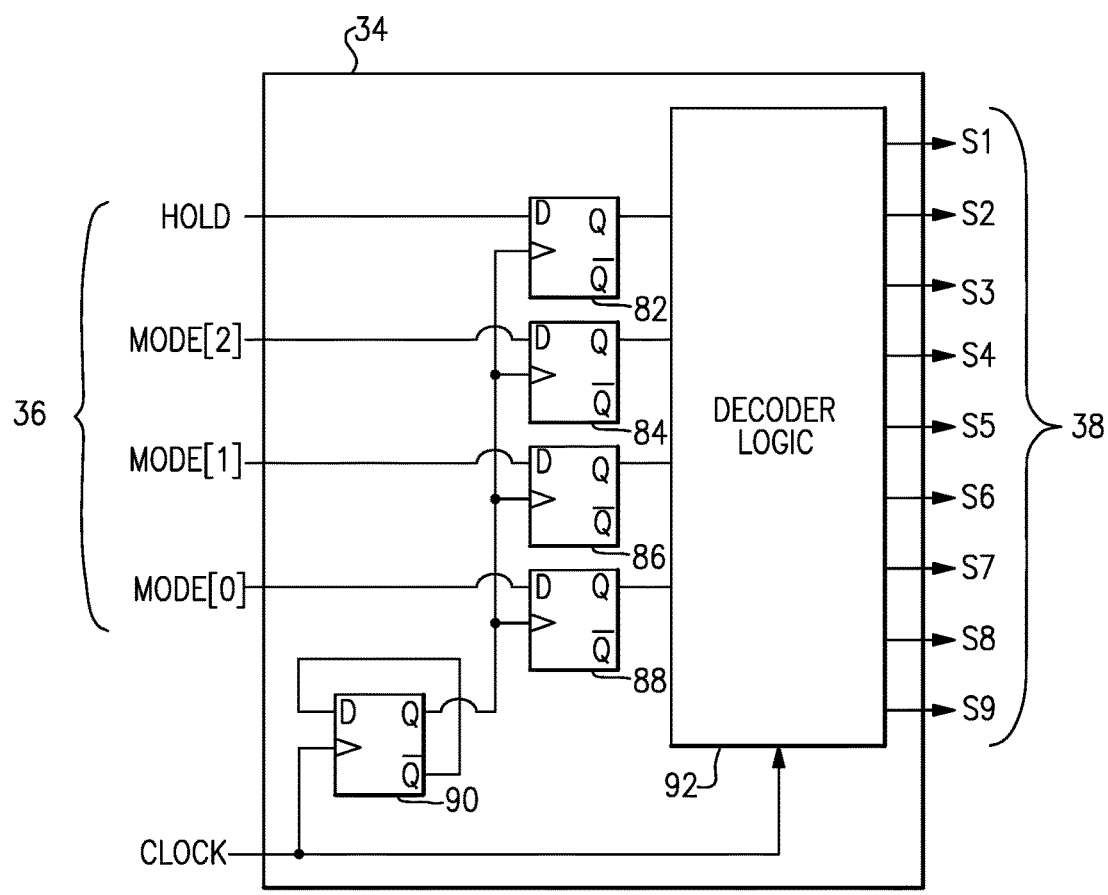
FIG. 10 is a circuit diagram illustrating example switch control logic shown in FIG. 3A and FIG. 3B.

As illustrated in FIG. 10, the switch control logic 34 can receive the mode selection signals 36, which may be in the above-described encoded form of a 3-bit word (MODE[2:0]) and the "hold" signal. The MODE[2:0] word and "hold" signal together can indicate the next mode to which switching logic 20 is to switch. The "hold" signal can be latched into a state element, such as a flip-flop 82, in the control logic 34. The MODE[2] bit can be latched into a state element, such as a flip-flop 84, in the control logic 34. The MODE[1] bit can be latched into a state element, such as a flip-flop 86, in the control logic 34. The MODE[0] bit can be latched into a state element, such as a flip-flop 88, in the control logic 34. The flip-flops 82-88 can latch their inputs, on every other cycle of the clock signal (CLOCK). Another flip-flop 90 can divide the clock signal by two and provide the divided clock signal to the clock inputs of flip-flops 82-88. Other state elements can be used instead of flip-flops, such as latches and the like.

The switch control logic 34 also includes decoder logic 92 coupled to the outputs of flip-flops 82-88. The decoder logic 92 can decode the latched MODE[2:0] word and "hold" signal into the individual switch control signals 38 (for example, S1-S9) that control the above-described switches 40-56 of the switch matrix 16 and/or any of the sub-switches in the switch matrix 16. While mode selection signals 36 can indicate the "next" mode, the latched MODE[2:0] word and "hold" signal can indicate the "current" mode. The decoder logic 92 can generate switch control signals 38 (for example, S1-S9) in response to the current mode and the clock signal.

The operation of some implementations of the decoder logic 92 is reflected in the circuit diagrams of FIGS. 4A-7B. It will be understood that for each mode configuration illustrated in FIGS. 4A-7B, the switches 40-56 assume the first phase configuration during one half of each clock cycle and assume the second phase configuration during the other half of each clock cycle. In response to the latched MODE [2:0] word indicating the 1/3 mode or "001," the decoder logic 92 can generate switch control signals 38 (for example, S1-S9) to set the switches 40-56 to the states shown in FIG. 4A during the first half of each clock cycle and to the states shown in FIG. 4B during the second half of each clock cycle. In response to the latched MODE[2:0] word indicating the 1/2A mode or "010," the decoder logic 92 can generate switch control signals 38 (for example, S1-S9) to set switches 40-56 to the states shown in FIG. 5A during the first half of each clock cycle and to the states shown in FIG. 5B during the second half of each clock cycle. In response to the latched MODE[2:0] word indicating the 1/2B mode or "011," the decoder logic 92 can generate switch control signals 38 (for example, S1-S9) to set switches 40-56 to the states shown in FIG. 6A during the first half of each clock cycle and to the states shown in FIG. 6B during the second half of each clock cycle. In response to the latched MODE [2:0] word indicating the 2/3 mode or "100," the decoder logic 92 can generate switch control signals 38 (for example, S1-S9) to set switches 40-56 to the states shown in FIG. 7A during the first half of each clock cycle and to the states shown in FIG. 7B during the second half of each clock cycle. In response to the latched "hold" signal indicating the "hold" mode, the decoder logic 92 can generate switch control signals 38 (S1-S9) to maintain switches 40-56 in their previous mode configurations during each half of the next clock cycle. It will be understood that any combination of the states described above can be implemented in the opposite halves of each clock cycle and/or for different portions/multiples of a clock cycle.

Figure 11:
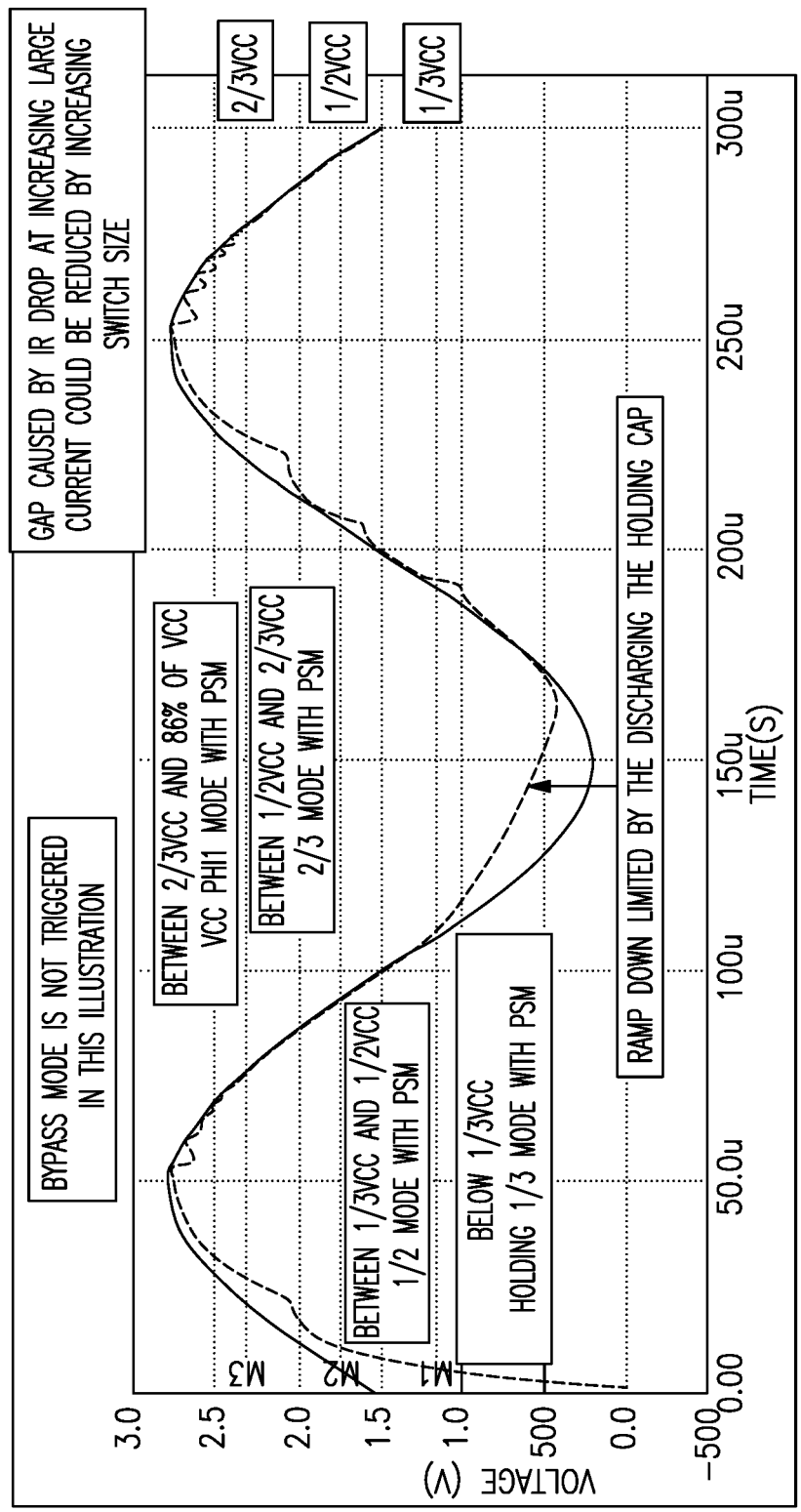
FIG. 11 is a timing diagram illustrating an example of operation of the voltage converter of FIG. 3A and FIG. 3B.
Figure 12:
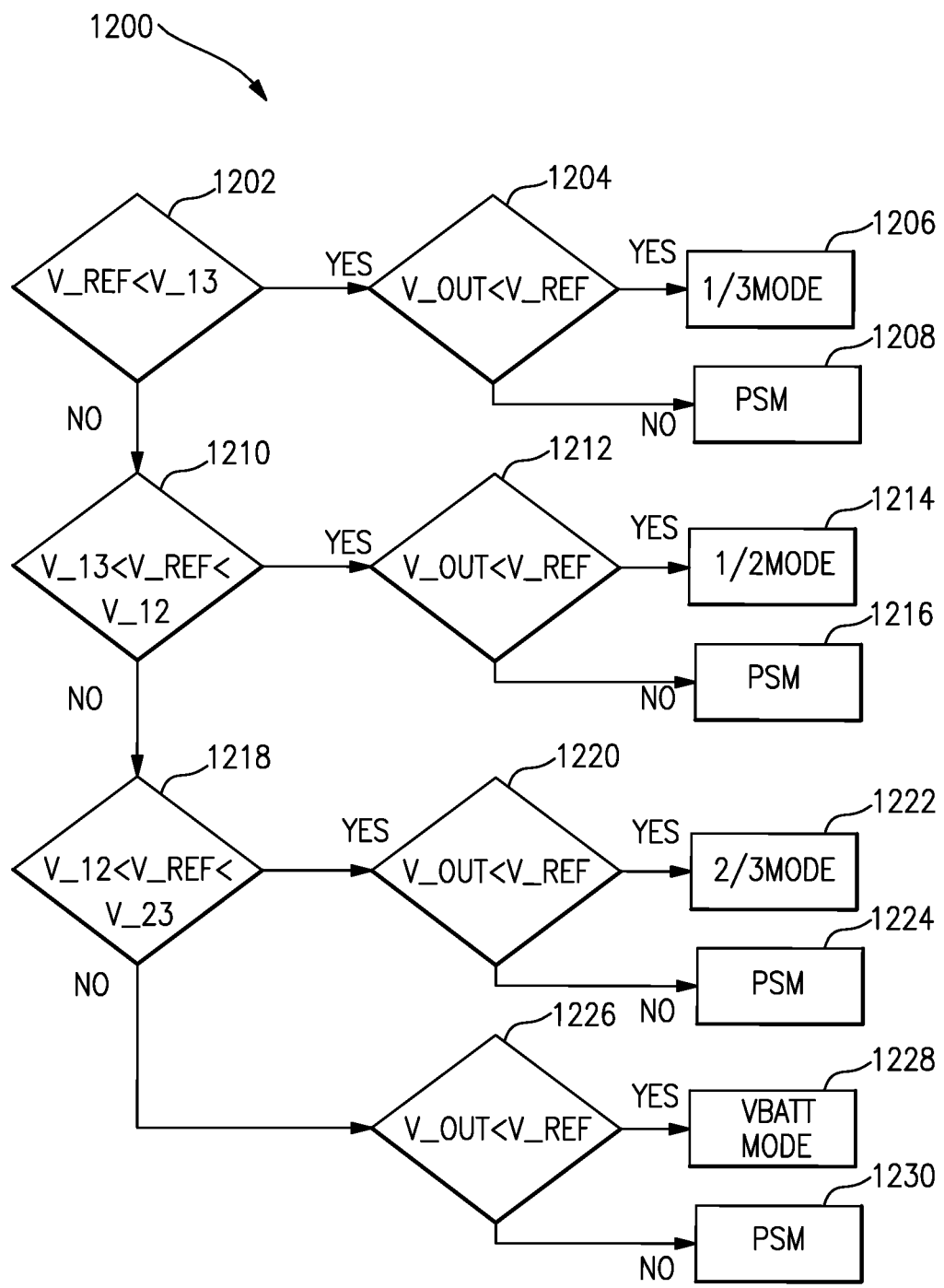
FIG. 12 is a flow diagram illustrating an example method of operation of the voltage converter of FIG. 3A and FIG. 3B.

FIGS. 11 and 12 illustrate example methods of toggling between different modes of operation in the DC-DC converters 214 described herein. Efficiency can be improved by stopping the clock in response to V_OUT crossing V_REF, thereby halting the switching network 16. While DC-DC converters corresponding to the graph shown in FIG. 11 and/or the flow diagram of FIG. 12 may include a specific number of modes for illustrative purposes, it will be understood that the principles and advantages described with reference to FIGS. 11 and/or 12 can be applied to a system with any suitable number of modes. Similarly, it will be understood that the threshold voltage levels (e.g., 1/3 Vcc, 1/2 Vcc, 2/3 Vcc) are also described for illustrative purposes, and any suitable voltage levels can be implemented with any combination of features described in reference to FIGS. 11 and/or 12.

FIG. 11 is a timing diagram illustrating an example operation of the DC-DC voltage converter 214 of FIGS. 3A and/or 3B. The timing diagram shows the reference voltage signal V_REF and the output voltage signal V_OUT in one embodiment. In FIG. 11, the voltage level of the output voltage signal V_OUT over time is represented by the dashed curve and the voltage level of the reference voltage signal V_REF over time is represented by the solid curve. As illustrated, the reference voltage signal V_REF is a relatively noise free signal. The output voltage signal V_OUT can track the reference voltage signal V_REF as the reference voltage signal V_REF changes via a DC-DC switched capacitor voltage converter. The Vcc voltage is provided by the battery in the graph shown in FIG. 11.

Depending on whether the output voltage signal V_OUT or the reference voltage signal V_REF has a higher voltage level, the DC-DC converter may operate in a pulse skipping mode (PSM). For example, when the reference voltage V_REF crosses 1/3 Vcc, the 1/3 mode may not be capable of increasing the output voltage V_OUT to be approximately equal to the reference voltage V_REF. As a result, the DC-DC converter 214 can switch to 1/2 mode. However, since the reference voltage V_REF may be just slightly higher than 1/3 Vcc, when changing to 1/2 mode, V_OUT may overshoot the reference voltage V_REF and draw substantial current, such as 3.0 mA, during an overshoot time period. In some cases, the overshoot voltage may depend on the load on the circuit. In some cases, the overshoot may be up to 2× the reference voltage. This can degrade the efficiency of the DC-DC converter 214. However, some of the embodiments presented herein can reduce or prevent the occurrence of the overshoot voltage and the consequential substantial current draw that may be associated with overshooting the reference voltage.

To address the problem of overshoot voltage, among others, the DC-DC converter 214 can operate in pulse skipping mode (PSM) and/or adjust effective switch size. In PSM mode, once the output voltage V_OUT passes the reference voltage V_REF (for example, V_OUT becomes greater than V_REF), the DC-DC converter 214 can turn-off an oscillator, let a load drain the current until the output voltage V_OUT becomes less than the reference voltage V_REF, and restart the clock to charge the output voltage V_OUT. Adjusting the switch size can be implemented, for example, as shown and described with reference to FIG. 8B. For example, based on the load current when the output voltage V_OUT just passes the reference voltage V_REF, at least a portion of the sub-switches can be turned off to increase an effective resistance of one or more of the switches. This can also help offset the current overshoot drawing from a supply voltage, such as Vbatt. This can also further increase the power efficiency.

Referring back to FIG. 11, in some implementations, when the output voltage V_OUT is greater than the reference voltage V_REF, the DC-DC converter 214 can operate in PSM mode. More specifically, while the reference voltage V_REF is below 1/3 Vcc, the mode control logic can keep the DC-DC converter 214 in the 1/3 mode when the output voltage V_OUT is less than the reference voltage V_REF. When the output voltage V_OUT is greater than the reference voltage V_REF, the DC-DC converter 214 can operate in the PSM mode instead of the 1/3 mode. When the reference voltage V_REF and the output voltage V_OUT are substantially equal, then the DC-DC converter 214 may operate in either mode, depending on the implementation. However, compare circuitry, such as the comparator circuitry 18, can determine small differences between the output voltage V_OUT and the reference voltage V_REF.

When the voltage level of the reference voltage signal V_REF exceeds 1/3 Vcc, the reference voltage V_OUT may not be able to exceed the reference voltage V_REF in 1/3 mode. As a result, the control logic 20 can toggle one or more switches in the switch matrix 16 such that the DC-DC converter 214 switches into the 1/2 mode. When V_REF is between 1/3 Vcc and 1/2 Vcc, the DC-DC converter 214 can remain in 1/2 mode when V_OUT is less than V_REF and transition to the PSM mode when V_OUT is greater than V_REF. Similarly, when V_REF is between 1/2 Vcc and 2/3 Vcc, the DC-DC converter 214 can operate in 2/3 mode when V_OUT is less than V_REF and operate in the PSM mode when V_OUT is greater than V_REF. Likewise, when V_REF is greater than 2/3 Vcc, the DC-DC converter 214 can operate in supply mode or Vbatt mode when V_OUT is less than V_REF and operate in the PSM mode when V_OUT is greater than V_REF. Each time the voltage level of the output voltage V_OUT crosses the reference voltage signal V_REF, the control logic 20 can cause the DC-DC converter 214 to operate in the PSM mode. Modes can be adjusted by toggling one or more switches in the switch matrix 16 such that the DC-DC converter 214 adjusts the mode.

As also shown in FIG. 11, ramp down can be limited by discharging a holding capacitor. In some implementations, it can be desirable for the collector voltage of a power amplifier 5 that uses the DC-DC converter 214 for biasing to be more than about 0.7 V. In addition, gaps separating the reference voltage signal V_REF and the output voltage signal V_OUT can be reduced in some instances, by increasing switch size so as to reduce IR drops at increasing currents.

FIG. 12 is a flow diagram illustrating an example process 1200 of operating the DC-DC voltage converter 214 of FIGS. 3A and/or 3B. A voltage converter can operate in a mode, for example, any of the modes described herein based on outputs generated from comparisons in a compare circuit, such as the compare circuit 18. For instance, one or more comparisons performed by the comparators of FIG. 8A can be used to determine a mode in which the DC-DC voltage converter 214 can operate.

In some implementations, the DC-DC voltage converter 214 can operate in a 1/3 mode when a reference voltage signal V_REF is less than 1/3 of a supply voltage. For instance, when the comparison at block 1202 indicates that V_REF is less than 1/3 of the supply voltage and the comparison at block 1204 indicates that the output voltage V_OUT is less than the reference voltage V_REF, the DC-DC converter 214 can be set to 1/3 mode at block 1206.

The DC-DC voltage converter 214 can operate in a 1/2 mode when a reference voltage signal V_REF is greater than 1/3 of a supply voltage and less than 1/2 of the supply voltage. For instance, when the comparison at block 1210 indicates that V_REF is between 1/3 of the supply voltage and 1/2 of the supply voltage and the comparison at block 1212 indicates that the output voltage V_OUT is less than the reference voltage V_REF, the DC-DC converter 214 can be set to 1/2 mode at block 1214.

The DC-DC voltage converter 214 can operate in a 2/3 mode when a reference voltage signal V_REF is greater than 1/2 of a supply voltage and less than 2/3 of the supply voltage. For instance, when the comparison at block 1218 indicates that V_REF is between 1/2 of the supply voltage and 2/3 of the supply voltage and the comparison at block 1220 indicates that the output voltage V_OUT is less than the reference voltage V_REF, then the DC-DC converter 214 can be set to 2/3 mode at block 1222.

The DC-DC voltage converter can operate in a supply mode when a reference voltage signal V_REF is greater than 2/3 of a supply voltage. For instance, when the comparison at block 1218 indicates that V_REF is between more than 2/3 of the supply voltage and the comparison at block 1226 indicates that the output voltage V_OUT is less than the reference voltage V_REF, then the DC-DC converter 214 can be set to Vbatt mode at block 1228.

Based on one or more comparisons in the compare circuit 18, the DC-DC converter 214 can also operate in PSM mode. For example, when the output voltage V_OUT is greater than the reference voltage V_REF, the DC-DC converter 214 can operate in a PSM mode. For example, based on the comparisons at blocks 1204, 1212, 1220, or 1226, the DC-DC converter 214 can be set to pulse skipping mode at blocks 1208, 1216, 1224, or 1230, respectively.

In some implementations, the DC-DC converter 214 may switch to bypass mode in response to the reference voltage V_REF reaching a certain percentage of Vcc. For example, as shown in FIG. 12, when the reference voltage V_REF reaches 2/3 Vcc, the DC-DC converter 214 can operate in Vbatt mode. The operations in FIG. 12 can be implemented concurrently, sequentially, or in any order, as appropriate.

PSM and FM Combination Overview

As previously described, in some embodiments, a DC-DC voltage converter can be designed to operate in a pulse skipping mode (PSM). When V_OUT exceeds V-REF for a DC-DC switched capacitor with PSM capability, the DC-DC voltage converter enters PSM mode, or enables PSM, which may result in an oscillator (e.g., the oscillator 24) being turned off. As previously described, in some such cases, a load may be used to drain the current until the resulting V_OUT drops below V_REF. Further, the switching network (e.g., switch matrix 16), used to modify V_OUT, may also be deactivated.

The Switched Capacitor DC-DC converter (e.g., the DC-DC voltage converter 214) may be capable of reducing the battery voltage in fixed ratios such as 1/2, 1/3, etc. This can be an efficient method of generating the output voltage because there is a current gain equal to the inverse of the voltage gain. There may be two phases for each switching mode (gain ratio)—charging and discharging the flying capacitors—and in normal operation, the clock duty cycle for each of these phases is just under 50%. However, there may be a short amount of non-overlap time when all switches to the flying capacitors are closed, resulting in duty cycles under 50%. Flying capacitors generally refers to capacitors that may float with respect to ground or a common node. In other words, in some configurations of a circuit, the flying capacitors may not be electrically connected to or may be isolated from ground. These flying capacitors may instead be electrically connected between two nodes other than ground. For example, with reference to FIG. 7A, the capacitor 12 is electrically connected between V-BATT and V_OUT, but is isolated from the ground node illustrated in FIG. 7A. In other words, a flying capacitor may be shifted to connect between different nodes other than ground. A non-flying capacitor may be between a node, such as V_OUT, and ground.

In some cases, there is an associated output resistance with each voltage ratio that is a function of three modulation parameters: switching frequency, the resistances of the switches, and the duty cycle of each phase. The output resistance is inversely proportional to frequency and directly proportional to the switch resistances and composite duty cycle. The output voltage follows the formula: $V\_OUT = V\_BATT * Av - R\_OUT * I\_OUT$, where Av is the voltage gain and I_OUT is the current pulled by the load. Due to the output resistance, the output voltage cannot reach V_BATT*Av. For a continuous output design where the desired output voltage can be set at a particular I_OUT, the output resistance may be modulated by one of the three parameters mentioned above.

In certain embodiments, once V_OUT falls below V_REF, PSM mode is deactivated, or disabled, and the oscillator may be restarted or reinitialized. Further, the switching network may need to be reactivated. In some implementations, it may take a non-negligible period of time to reactivate or restart the oscillator, associated clock generator, and related systems (e.g., switching network). For example, it may take up to 10 µs to begin operating the switch network after reactivating the clock before V_OUT begins to catch up with V_REF. In some communication systems, this 10 µs restart time can result in a call being dropped. Further, because the oscillator requires time to restart, there may be a delay in reactivating the switching network. Moreover, activating and deactivating the oscillator can create an effective switching frequency that is higher than a manufacturer intended frequency of the oscillator. This higher frequency causes a reduction in the power efficiency of the system.

In some implementations, a signal comparing V_OUT to the reference voltage is used to turn off the oscillator when the output voltage becomes too high. This allows the load to pull down the output voltage. In terms of the modulation parameters, the duty cycle of one phase relative to the other phase would no longer be 1:1 but would rise to values as high as 15:1, and the frequency would rise by as much 140% before dropping to roughly 50% of the original frequency. When frequency rises, the current used to drive the switches also rises, reducing efficiency.

In certain embodiments of the present disclosure, the DC-DC voltage converter can be configured to use frequency modulation (FM) in addition to PSM. The FM may be implemented by using the amplified error signal to drive a voltage to a current conversion stage, and to drive a voltage controlled oscillator to dynamically adjust switching frequency based on the V_REF level. Advantageously, in certain embodiments, by using FM when operating in PSM mode, the oscillator of the DC-DC voltage converter may be kept operational eliminating the process of reinitializing the oscillator when exiting PSM mode and improving the efficiency of the converter. In other words, in certain implementations, operation of the DC-DC voltage converter can be improved by reducing or eliminating the amount of time for initializing or reinitializing the oscillator before switching between voltage modes (e.g., switching between 1/2 Vcc and 2/3 Vcc) and deactivating PSM. Further, in certain embodiments, using both PSM and FM can be particularly effective at low power regions where V_OUT and/or I_OUT are low because the driver current can play a much larger role in the efficiency of the DC-DC voltage converter.

Example Voltage Converter Using PSM and FM

Figure 13:
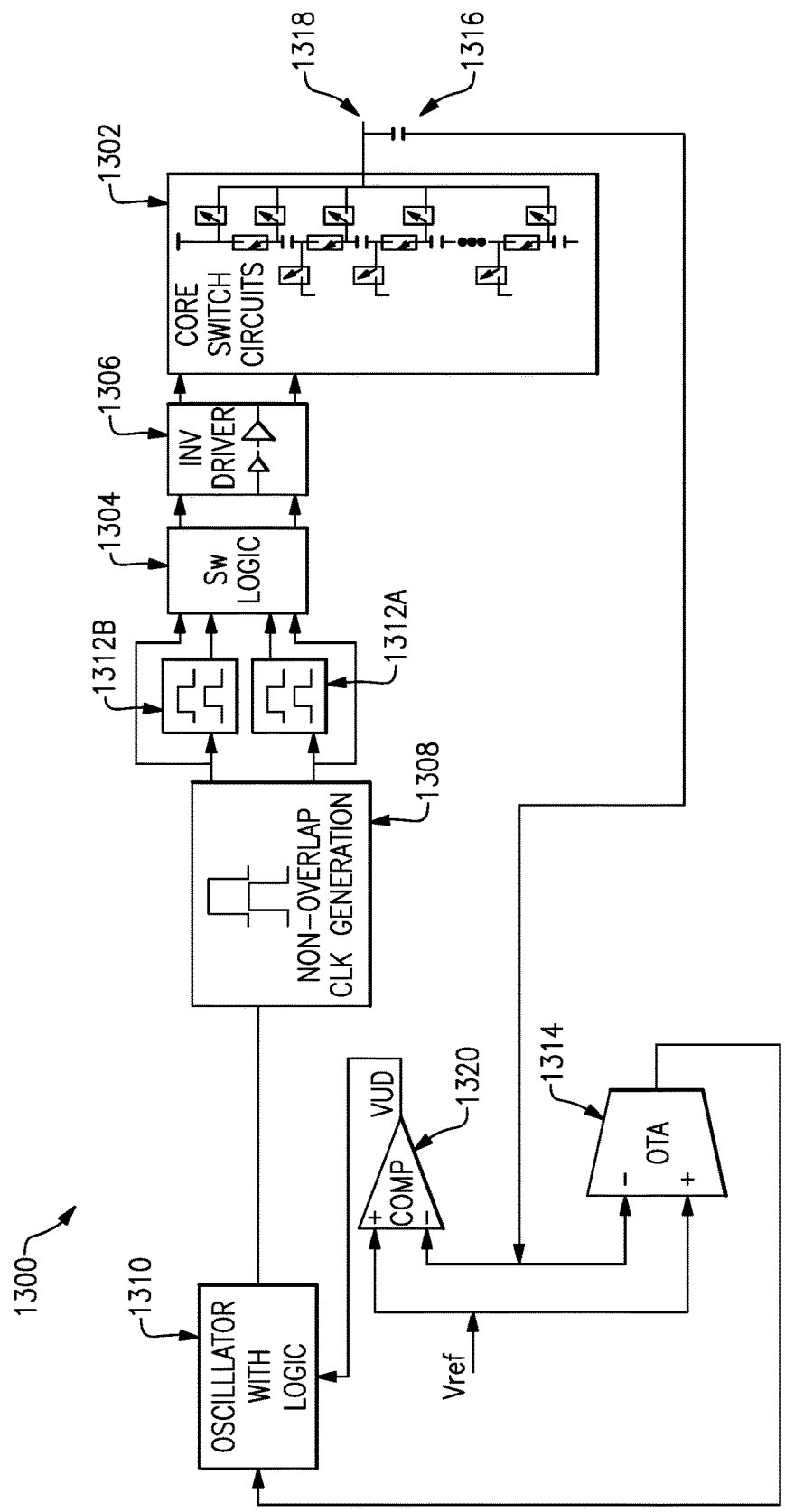
FIG. 13 is a schematic block diagram of a voltage converter that can operate using both PSM and FM in accordance with certain embodiments.

FIG. 13 is a schematic block diagram of a voltage converter 1300, such as a DC-DC voltage converter, that can operate using both PSM and FM in accordance with certain embodiments. The voltage converter 1300 may include some or all of the embodiments previously described with respect to the DC-DC voltage converter 214. For example, similar to the embodiments of the DC-DC voltage converter 214 illustrated in FIG. 2 and in FIGS. 3A and 3B, the voltage converter 1300 may include a switch array or switch matrix 1302. This switch matrix 1302 may include a number of switches that may be closed and opened so as to charge and discharge a number of capacitive elements, or capacitors, included as part of the switch matrix 1302. As with the switch matrix 16, the number and type of capacitors that may be included by the switch matrix 1302 is not limited. For example the switch matrix 1302 may include two capacitors, three capacitors, ten capacitors etc. The output of the switch matrix 1302, V_OUT, may be provided to a system or circuitry that operates using direct current at a particular voltage level. For example, the output voltage, V_OUT, of the switch matrix 1302 may be provided to a power amplifier (e.g., the power amplifier die 204 or a power amplifier 5). In some embodiments, filter circuitry, such as a capacitor 1316, may be provided at the output node 1318. This filter circuitry may be used to filter the output voltage signal V_OUT.

The voltage converter 1300 may further include control logic or switch logic 1304 for controlling when the switches of the switch matrix 1302 are opened or closed. As previously described with respect to the control logic 17, the switch logic 1304 may include a comparator circuit similar to the comparator circuit 18 for comparing a reference voltage, V_REF, with an output voltage, V_OUT, output by the switch matrix 1302. The control signals of the switching logic 1304 may be based at least partially on the comparison between the V_REF and the V_OUT.

Further, the control signals output by the switch logic 1304 may be provided to a driver 1306 before being provided to the switch matrix 1302. The driver 1306 may be an inverter driver that is composed of a series of inverter circuits and is designed to have an optimized driving ability stage by stage. Although the driver 1306, in some cases, may be formed from inverters, the driver 1306 is typically not intended to invert the signal, but to boost the driving capability. However, in some cases, the driver 1306 may be designed to invert the signal. The inverter circuits may be formed from pFET and nFETs. The driver 1306 can provide the capability of driving the large capacitive loads of the switch gates in the switch matrix 1302. Typically, the purpose of the driver 1306 is to boost driving capability, rather than to invert signals.

The voltage converter 1300 may further include a clock signal generator 1308 which may generate a number of clock signals (e.g., clock signals 1312A and 1312B) based on a signal provided or generated by an oscillator 1310. In certain embodiments, the clock signal generator 1308 and the oscillator 1310 may include some or all of the embodiments described with respect to the clock signal generator 22 and associated oscillator 24 in FIG. 3A or FIG. 3B. However, in contrast to the oscillator 24 that is activated by the enable signal, the oscillator 1310 receives a signal from a voltage controlled current source (VCCS). Although not limited as such, the VCCS may be an operational transconductance amplifier (OTA) 1314, as illustrated in FIG. 13. The OTA 1314 may cause a frequency generated by the oscillator 1310 to be modulated based on a current provided by the OTA 1314. The current provided by the OTA 1314 may be based on a delta or a difference between the V_REF and the V_OUT (V_REF−V_OUT). The greater the delta between the V_REF and the V_OUT, the greater the current produced by the OTA. When V_OUT>V_REF, delta V may be negative and the oscillator typically runs at its minimum frequency. Thus, the magnitude of delta V may effectively have little to no impact on the oscillator frequency beyond triggering the minimum frequency in this case. However, when V_REF>V_OUT, delta V may be positive and can be used to set the OTA current, which can set or correspond to the oscillator frequency.

During operation, the OTA 1314 may cause the oscillator 1310 to reduce its generated frequency when V_OUT exceeds V_REF. On the other hand, when V_REF exceeds V_OUT, the OTA 1314 may cause the oscillator 1310 to increase its generated frequency. In other words, in certain cases, frequency modulation may be performed based on the relationship between V_REF and V_OUT.

In general, the current produced by the OTA 1314 may be proportional to the difference between V_OUT and V_REF, or ΔV. As the frequency may be directly proportional to the current input, the oscillator frequency can be considered proportional to ΔV, or delta V. The oscillator frequency may be kept within a continuous range. Further, the current, and thus the oscillator frequency may have a maximum and a non-zero positive minimum. When V_OUT>V_REF, the OTA current may be set to its minimum value, and therefore the oscillator 1310 may be set to its minimum non-zero operating frequency. If the frequency is at a minimum but V_OUT remains greater than V_REF, PSM may be used in parallel with the FM to further reduce V_OUT. Further, a higher frequency can reduce output impedance so that V_OUT more closely approaches or tracks V_REF under high output current conditions. A lower frequency can improve power efficiency by reducing the charging and discharging of the switch capacitances, which can be relatively large resulting in a sizeable wasted amount of current. Thus, advantageously, reducing output current as V_OUT approaches V_REF or when V_OUT exceeds V_REF can save power.

As previously described, the DC-DC voltage converter may include a number of comparators that may be used to determine the switch configurations for the switches of the switch matrix. One of these comparators, for example the comparator 1320, may compare the V_OUT with the V_REF. The output of this comparison may be referred to as V_UD. When the output voltage, V_OUT, of the DC-DC voltage converter 1300 is less than the reference voltage, V_REF, the V_UD has a logical one value. In some such cases, the switch matrix 1302 is configured such that the capacitors of the switch matrix 1302 continue to charge. Further, when the V_UD has a logical one value, the switch matrix 1302 is configured such that the output voltage, V_OUT, continues to rise. The charging of the capacitors and the increasing output voltage may be due to a source voltage supply, V_BATT (not shown), supplied to the DC-DC voltage converter 1300.

When the V_UD value is high, or logically one, the DC-DC voltage converter disables PSM and the frequency of the oscillator signal is modulated (e.g., FM is performed) by the OTA based on the difference between the V_OUT and V_REF values. The amount that the frequency is modulated, although typically related to delta V, may be application-specific or environmental-specific. On the other hand, when the V_UD value is low, or logically zero, the DC-DC voltage converter enables PSM and the oscillator may be configured to run at a minimum operational frequency, which may be application-specific or environment-specific. In some cases when V_UD is logic zero, the switches of the switch matrix may be configured to allow the capacitors of the switch matrix to drain and the supply voltage to be electrically disconnected from the switch matrix. Further, as the supply voltage is cut off and the capacitors drain, the output voltage is reduced. In addition, the oscillator signal may be reduced to a lower frequency by the OTA 1314. Once, the output voltage falls below the reference voltage, V_UD may become logically one and the frequency of the oscillator signal may be restored to a higher operational frequency. Further, PSM may be disabled.

As stated above, the frequency modulation may be related to the amount of difference between the output voltage and the reference voltage. For example, in cases when V_OUT<V_REF, as V_OUT increases, the difference between V_REF and V_OUT decreases (e.g., V_REF-V_OUT decreases). As the difference between the reference voltage and output voltage decreases, the output current of the OTA decreases. Consequently, the frequency of the oscillator decreases. This reduction in frequency in relation to the reduction of the output current from the OTA can serve as a form of FM control via the voltage controlled current source (VCCS), which is implemented by the OTA.

As the output voltage increases and approaches the reference voltage, the oscillator frequency decreases. Advantageously, in certain embodiments, the reduction in the oscillator frequency results in improved power efficiency for the DC-DC converter because as the difference between the reference voltage and the output voltage decreases, the DC-DC voltage converter uses less energy to further increase the output voltage. Further, once the output voltage surpasses the reference voltage (V_OUT>V_REF), the oscillator can be set to run at a low or minimum operating frequency. This minimum operating frequency can be a minimum signal frequency that enables the oscillator to continue operating instead of being turned off. In some cases, the minimum operating frequency may be based on the oscillator or may be application-specific. Thus, in some cases, when V_OUT<V_REF, the DC-DC converter operates in a FM mode that uses a continuously adjusted or modified frequency. Further, when V_OUT>V_REF, the DC-DC converter may operate in a PSM mode with the oscillator operating at a minimum operating frequency.

In some implementations, one or more of the comparators included in the control logic of the DC-DC voltage converter may be hysteresis comparators. For example, the comparator 1320 may be a hysteresis comparator. Advantageously, in certain embodiments, using a hysteresis comparator reduces or prevents continuous or rapid mode changes of the switch matrix 1302 or the DC-DC voltage converter 1300. The rapid mode changes may occur because of noise or because the output voltage hovers around the reference voltage. For example, the DC-DC voltage converter 1300 may be configured to operate in one mode when the output voltage exceeds the reference voltage and may be configured to operate in a second mode when the output voltage falls below the reference voltage. As the output voltage oscillates between a point above the reference voltage and a point below the reference voltage, there may be continuous or rapid mode changes of the DC-DC voltage converter 1300 and in some cases, the DC-DC voltage converter 1300 may not complete entering a first mode before being reconfigured to enter a second mode. Thus, the hysteresis comparator 1320 enables more stable transitions between modes of the DC-DC voltage converter 1300 and prevents undesirable rapid changes between modes of the DC-DC voltage converter 1300. In certain embodiments, the hysteresis comparator 1302 may enable more stable transitions by, for example, introducing a small hysteresis voltage. This small hysteresis voltage can be used to prevent rapid fluctuations by, for example, requiring a voltage that surpasses a threshold, which may cause a state change, to drop below the threshold by at least the hysteresis voltage level before reverting to the previous state or transitioning to another state.

Typically, the hysteresis value applied to the hysteresis comparator 1320 is set to a few millivolts. In other cases, the hysteresis value may relate to a number of clock cycles that a voltage should be below a threshold before triggering a state change. However, the hysteresis value of the hysteresis comparator 1320 may be selected based on a minimum period of time that the DC-DC voltage converter 1300 should remain in a particular state. Some cases, minimum period of time may be one clock cycle or a number of clock cycles required to initialize a component of the DC-DC voltage converter 1300, such as the oscillator 1310 or one or more switches of the switch matrix 1302.

As illustrated in FIG. 13, in some embodiments the oscillator 1310 may include logic. This logic can be used to determine whether the oscillator 1310 is to generate a signal with a frequency based on a current received from the OTA 1314 or whether the oscillator 1310 should generate some other frequency signal, such as a signal with a minimum operating frequency for the DC-DC voltage converter 1300. Although illustrated as one system, in some implementations the logic may be separate from the oscillator 1310. A number of implementations for the logic are possible. For example, the oscillator 1310 may include a multiplexor that can output a minimum frequency signal or a signal with a frequency based on a current from the OTA 1314 based on the V_UD signal, or some other control signal. As a second example, the oscillator 1310 may include one or more combinational gates for controlling whether an output of the oscillator is a minimal operating frequency or a frequency based on the output of the OTA 1314. In some embodiments, the output of the OTA 1314 may serve as the control signal for the oscillator 1310.

In some implementations, when the V_UD signal is high, indicating that the output voltage of the DC-DC voltage converter 1300 is below the reference voltage, the output signal from the oscillator 1310 may have a frequency determined based on a current output by the OTA 1314. Thus, a form of frequency modulation may occur where the frequency of the output signal is directly proportional to the current output by the OTA 1314. Further, the current output by the OTA 1314 may be based on the difference between the V_REF and V_OUT signals. In some cases, the greater the difference between the V_REF and V_OUT signals, the higher the frequency of the signal output by the oscillator 1310. In some embodiments, the oscillator 1310 may have a maximum frequency value. In some such cases, once the difference between the V_REF and V_OUT signals reaches a threshold, the oscillator 1310 may be set to output a signal at the maximum frequency.

However, when V_UD is low and PSM is enabled, the output of the oscillator 1310 may be set to a minimum operating frequency regardless of the current provided by the OTA 1314. In some such cases, the system may be designed to cause the oscillator to run at a minimum operating frequency for the purpose of saving power while maintaining the oscillator 1310 in an active state. In such embodiments, when V_UD is high after a period of being low, the oscillator does not need to be reactivated because the oscillator 1310 remained in an active state. Thus, in certain embodiments, transitions between modes of the DC-DC voltage converter 1300 may be performed more efficiently and faster.

Second Example Voltage Converter Using PSM and FM

Figure 14A:
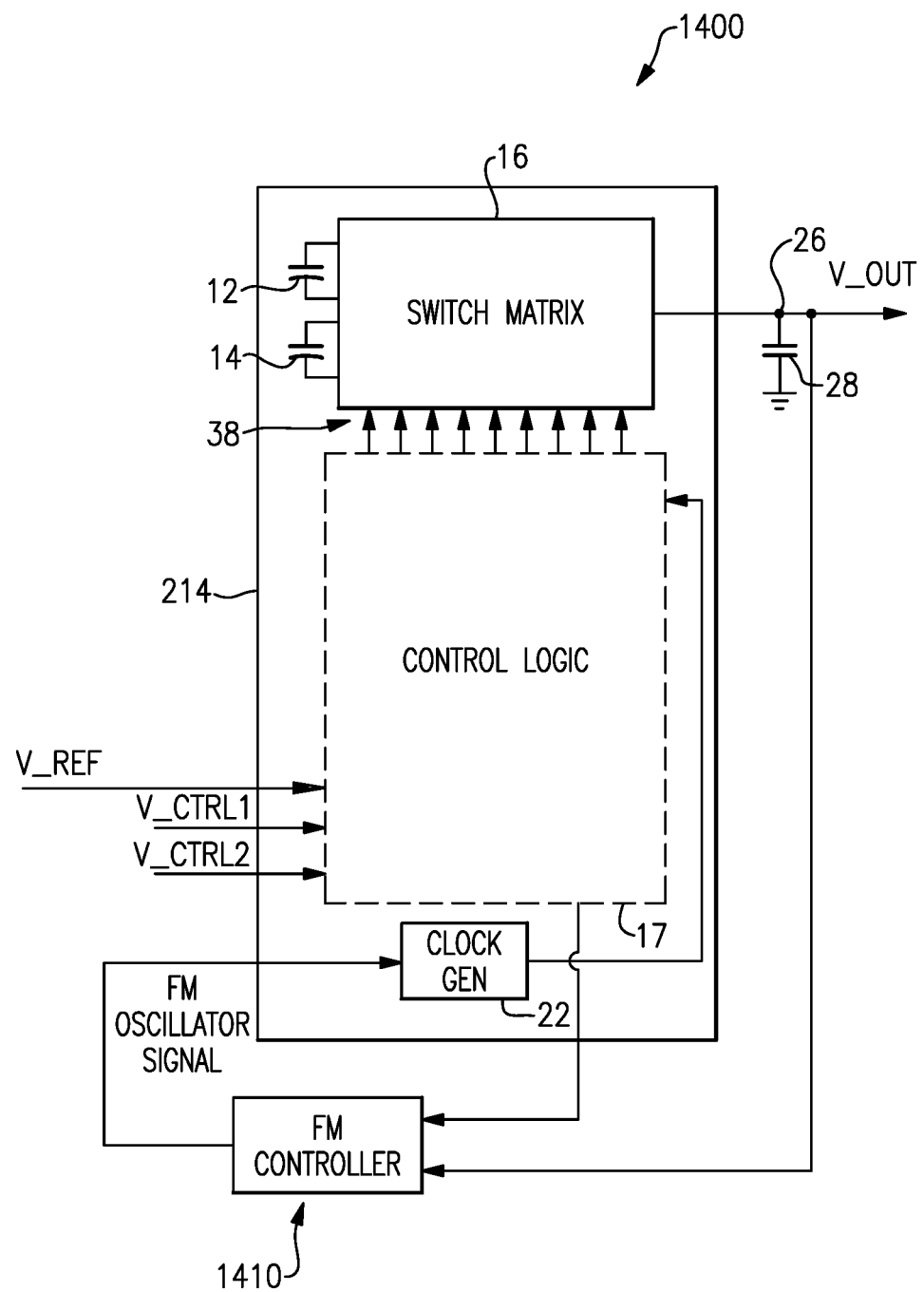
FIG. 14A is another schematic block diagram of a voltage converter that can operate using both PSM and FM according to certain embodiments.

FIG. 14A is another schematic block diagram of a voltage converter that can operate using both PSM and FM according to certain embodiments. The voltage converter 1400 provides similar functionality as the DC-DC voltage converter 1300, but is illustrated using a design similar to that of the DC-DC voltage converter 214. Thus, elements of the voltage converter 1400 that are in common with the DC-DC voltage converter 1300 and/or the DC-DC voltage converter 214 share the same reference numerals.

The voltage converter 1400 includes control logic 17 that can control the switches of the switch matrix 16. Further, the control logic 17 can provide a control signal (e.g., V_UD or $V_{UD}$) to the FM controller 1410. The FM controller 1410 can use the control signal in combination with an output voltage signal to determine a frequency modulated (FM) oscillator signal, which can be provided to the clock generator 22. Advantageously, the FM controller 1410 can modify the oscillator signal and consequently the clock signal generated by the clock generator 22 within a desired frequency range. Although in some cases the FM controller 1410 can deactivate the oscillator and provide no signal, or a constant value, typically the FM controller 1410 varies the FM oscillator signal between a minimum frequency and a maximum frequency. Often, the minimum frequency is selected to be a minimum operating frequency that enables the oscillator to continue operating without being deactivated or without requiring the oscillator to be reinitiated prior to exiting a PSM mode for the DC-DC voltage converter 1400.

Figure 14B:
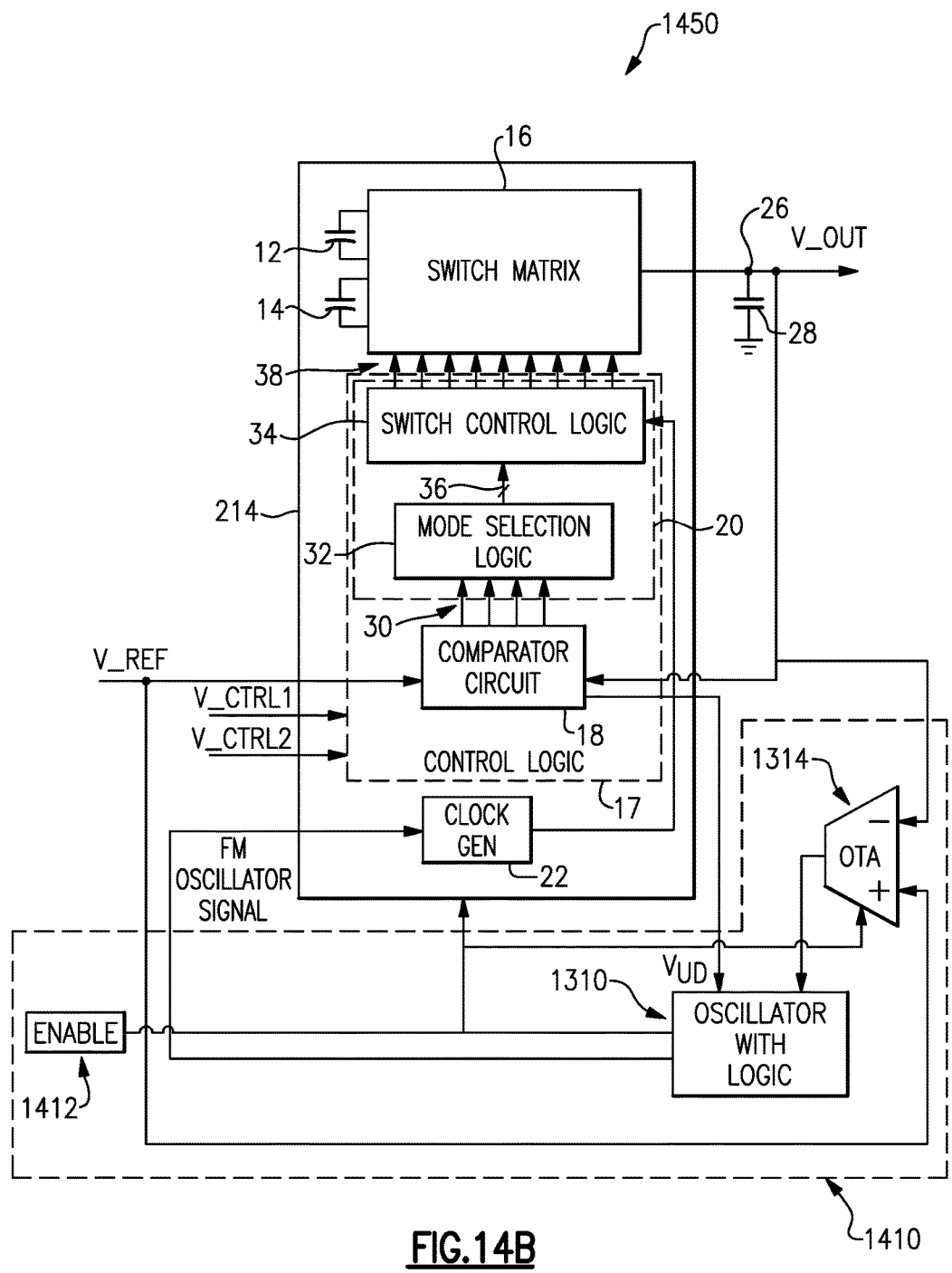
FIG. 14B is a schematic block diagram illustrating additional details of the voltage converter presented in FIG. 14A.

FIG. 14B is a schematic block diagram illustrating additional details of the voltage converter presented in FIG. 14A. The voltage converter 1450 is an embodiment of the voltage converter 1400 that illustrates additional details of the voltage converter 1400. As with the voltage converter 1400, the voltage converter 1450 provides similar functionality as the DC-DC voltage converter 1300, but is illustrated using a design similar to that of the DC-DC voltage converter 214. Thus, elements of the voltage converter 1450 that are in common with the DC-DC voltage converter 1300 and/or the DC-DC voltage converter 214 share the same reference numerals.

As illustrated in FIG. 14B, in contrast to the enable signal that is provided to the DC-DC voltage converter 214 of FIGS. 3A and 3B, a frequency modulated (FM) oscillator signal is provided to the clock generator 22 of the DC-DC voltage converter 1450. The FM oscillator signal may vary based at least in part on whether the output voltage exceeds the reference voltage. In some implementations, the V_CTRL1 and V_CTRL2 inputs may be omitted. For example, the V_CTRL1 and V_CTRL2 inputs may be replaced by the outputs of the comparator circuit 18. These outputs can be based on the V_REF signal.

The FM controller 1410, which is represented by a dashed line box, includes the OTA 1314 and the oscillator 1310, which were both previously described above. As previously described, the OTA 1314 can modulate the frequency of the signal output by the oscillator 1310, which is provided to the clock generator 22. Further, the comparator circuit 18 can provide a control signal to the oscillator 1310 that can be used to determine whether the oscillator 1310 is set to a minimum operating frequency.

In some embodiments, the DC-DC voltage converter 1450 may receive an enable signal, or alternatively, a disable signal. This enable signal may be received over an enable input 1412 or enable pin, which may be included by the FM controller 1410. Alternatively, the enable input 1412 may be a disable input. The signal received over the enable input 1412 may be used to shut down the DC-DC voltage converter 1450. As illustrated in FIG. 14B, the signal from the enable input 1412 may be provided to various elements of the DC-DC voltage converter 1450 including the OTA 1314, the oscillator 1310, and the DC-DC converter block 214 and used to shut down or deactivate the various elements. Alternatively, the lack of receiving the signal may be used to shut down or deactivate the various elements of the DC-DC voltage converter 1450.

Driver Circuit Current

Figure 15:
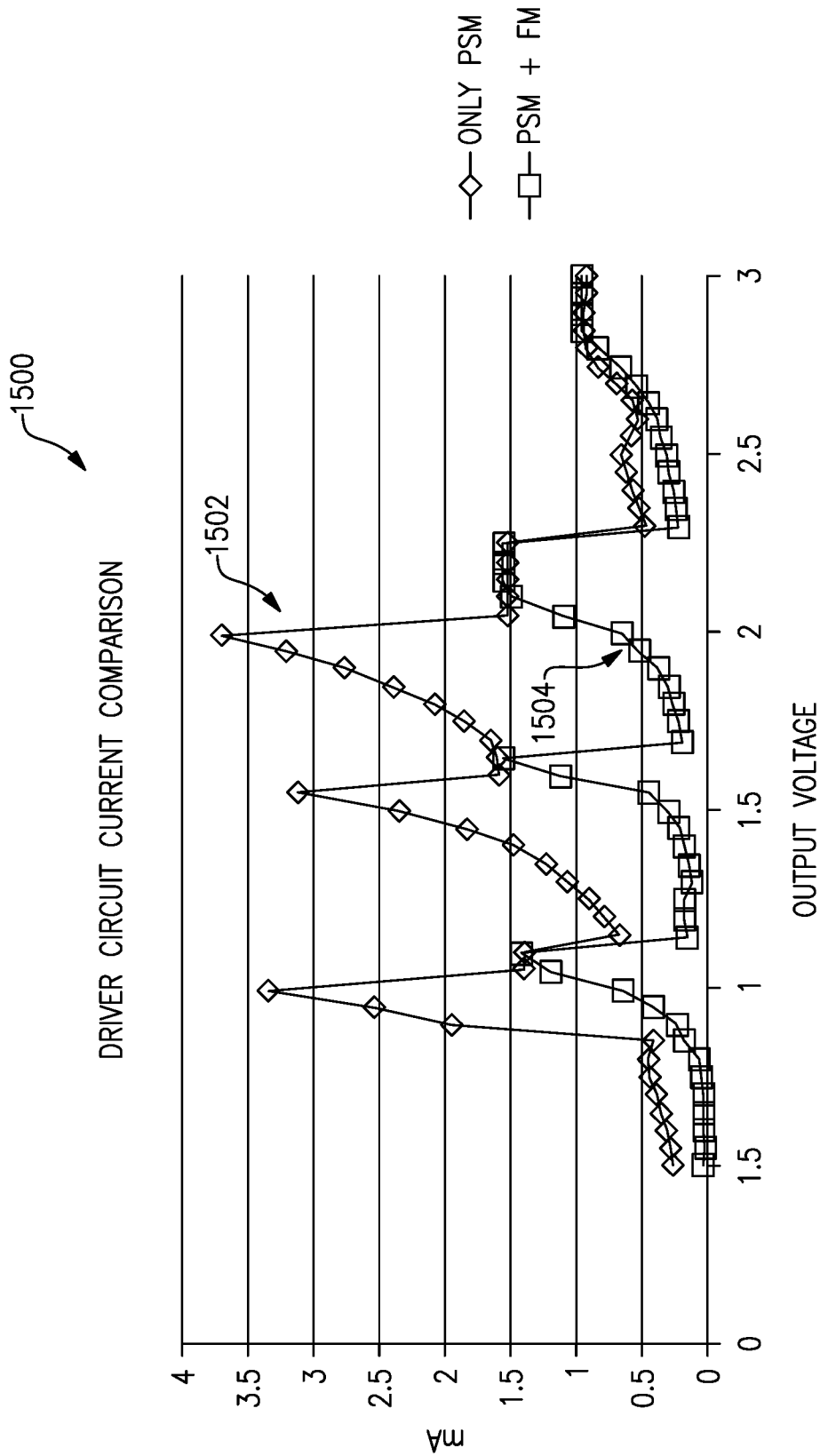
FIG. 15 is a graph comparing the difference in driver circuit current drawn by a voltage converter operating with PSM and a voltage converter operating with PSM and FM.

FIG. 15 is a graph 1500 comparing the difference in driver circuit current drawn by a voltage converter operating with PSM and a voltage converter operating with PSM and FM, such as the DC-DC voltage converter 1450. Typically, the switches of the switch matrix 16 are very large and therefore have a large gate capacitance on the order of a few hundred pF. Turning the switches on and off may require charging and discharging these large capacitances by the driver circuit. The current may be proportional to switching frequency and capacitance, or switch size. Typically, the current being drawn is not going to the output load, but is instead dissipated as heat. Thus, the efficiency of the DC-DC voltage converter is reduced. As illustrated by the graph 1500, a design of a DC-DC voltage converter that uses both PSM and FM has a reduced driver current across a set of output voltages compared to a voltage converter that utilizes only PSM. Thus, a design that uses both PSM and FM is more efficient than a design that utilizes only PSM.

Further, as illustrated by the line 1502, the current of a DC-DC voltage converter that utilizes only PSM spikes around 1 volt, 1.5 volts, and 2 volts and can reach over 3.5 mA. As illustrated by the line 1504, a DC-DC voltage converter that utilizes both PSM and FM also has current spikes around 1 volt, 1.5 volts, and 2 volts. However, as illustrated by the graph 1500, the current spikes are less than 50% of the current spikes of the DC-DC voltage converter that utilizes only PSM. Thus, the DC-DC voltage converter that utilizes both PSM and FM has a much greater efficiency than the DC-DC voltage converter that does not implement FM both across the range of voltage values and at voltage points associated with a high current. The voltage points with the high current values, or current spikes, may be attributed to points of high switching frequency within the switch matrix relating to a high frequency of turning the oscillator on and off.

Figure 16:
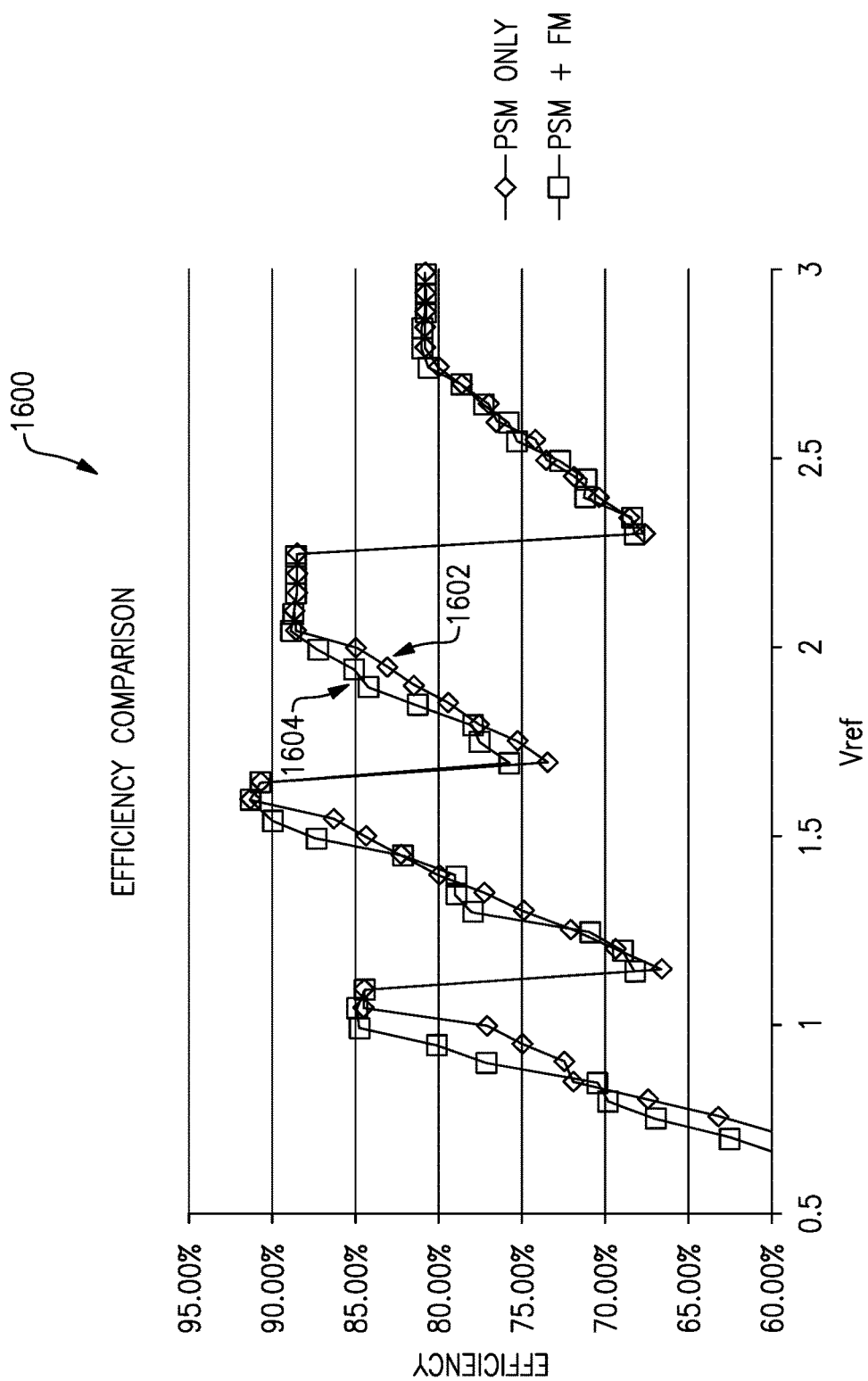
FIG. 16 is a graph comparing the efficiency of a DC-DC voltage converter operating with PSM with a DC-DC voltage converter operating with PSM and FM.

FIG. 16 is a graph 1600 comparing the power efficiency of a DC-DC voltage converter operating with PSM with a DC-DC voltage converter operating with PSM and FM. The line 1602 represents the efficiency of a DC-DC voltage converter operating with PSM. The line 1604 represents the efficiency of a DC-DC voltage converter operating with PSM and FM. As can be seen by comparing line 1602 with line 1604, the efficiency is roughly the same or better across a range of reference voltages. In other words, despite the oscillator continuing to be powered for the DC-DC voltage converter that operates with PSM and FM, the efficiency of the DC-DC voltage converter remains comparable to or better than the DC-DC voltage converter that deactivates its oscillator when not in use. In particular, at low power ranges (e.g., when V_REF<1.0V), the efficiency is improved with the PSM and FM implementation compared to the PSM only implementation of the DC-DC converter.

Applications

Some of the embodiments described above have provided examples in connection with wireless devices, such as mobile phones, that include power amplifiers. However, the principles and advantages of the embodiments can be used for any other systems or apparatus that have a need for DC-DC voltage conversion.

Such systems with DC-DC converters can be implemented in a variety of electronic devices including, for example, consumer electronic products, parts of the consumer electronic products, electronic test equipment, etc. The consumer electronic products can include, but are not limited to, a mobile phone (e.g., a smart phone), a telephone, a television, a computer monitor, a computer, a hand-held computer, a tablet computer, a laptop computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Parts of the consumer electronic products that can include a DC-DC converter as described herein can include a multi-chip module, a power amplifier module, an integrated circuit including a DC-DC converter, etc. Moreover, other examples of the electronic devices can also include, but are not limited to, memory chips, memory modules, circuits of optical networks or other communication networks, and disk driver circuits. Further, the electronic devices can include unfinished products.

Additional Embodiments

One aspect of this disclosure is an apparatus that includes a switch matrix and control logic. The switch matrix can include switches configurable into a plurality of states corresponding to a plurality of voltage levels of an output voltage. The switch matrix may be configured to adjust a state of at least one of the switches based at least in part on one or more mode control signals. The control logic may have a first input coupled to a first voltage generated from a voltage supply and a second input coupled to a reference voltage independent of the voltage supply. The control logic may be configured to compare the first voltage generated from the voltage supply with the reference voltage independent of the voltage supply. The control logic may be further configured to generate the one or more mode control signals based at least in part on the comparison.

The apparatus can also include a plurality of capacitive circuit elements operatively coupled to the switch matrix. The switch matrix can be configured to adjust electrical connections between the capacitive circuit elements and an output node. Two or more of the switches in the switch matrix can be controlled by different mode control signals. The switch matrix can also be configured to implement a plurality of modes, each mode having a first phase configuration in which at least one of the plurality of capacitive circuit element is charged and a second phase configuration in which the at least one of the plurality of capacitive circuit element is discharged.

The control logic can also be configured to compare the reference voltage to a second reference voltage generated from the power supply, in which the second reference voltage generated from the power supply has a different potential difference than the first voltage generated from the power supply. The one or more mode control signals can be generated based on comparing the reference voltage to the second reference voltage generated from the power supply. The control logic can also be configured to compare the reference voltage to a third voltage generated from the power supply, in which the third reference voltage generated from the power supply has a different potential difference than the first voltage generated from the power supply and the second voltage generated from the power supply. The one or more mode control signals can be generated based on comparing the reference voltage to the third voltage generated from the power supply. The control logic can be programmable between continuous and discrete voltage modes. In some cases, the output voltage may not be filtered by an inductor of an LC filter.

The reference voltage can track an output power of a power amplifier. The apparatus can also include a bypass capacitor having a first end coupled to the reference voltage and a second end coupled to analog ground. Noise on the second reference voltage can be at least about an order of magnitude less than noise on the output voltage.

Another aspect of the disclosure is a multi-chip module that includes a power amplifier die including one or more power amplifiers and a controller die. The controller die may include a power amplifier bias control and a direct current to direct current (DC-DC) converter. The DC-DC converter may be configured to generate an output voltage based on one or more mode control signals. Further, the DC-DC converter may have mode control logic configured to compare a plurality of voltages generated from a voltage supply to a reference voltage independent of the voltage supply and to generate the one or more mode control signals based at least in part on the comparisons.

The power amplifier die can include a GaAs device and the controller die can include a CMOS device. The power amplifier can include a CDMA power amplifier, such as a dual-band CDMA power amplifier or a tri-band CDMA power amplifier. The multi-chip module can be configured to be mounted on a phone board.

Another aspect of this disclosure is a mobile device that includes a battery, a power amplifier, and a direct current to direct current (DC-DC) voltage converter. The battery can be configured to power the mobile device. The power amplifier may be configured to amplify a radio frequency (RF) input signal and to generate an amplified RF output signal. The DC-DC voltage converter can be configured to generate an output voltage to control the power amplifier so as to improve power efficiency. The DC-DC voltage converter can include a switch matrix having a plurality of mode configurations corresponding to a plurality of output voltage levels. The switch matrix may be configured to adjust a state of one or more switches based at least in part on one or more mode control signals. The DC-DC voltage converter can also include control logic configured to compare a first voltage generated from the battery to a reference voltage indicative of an output power of the power amplifier, and to generate the one or more mode control signals based at least in part on the comparison. The DC-DC voltage converter can be configured to transition into pulse skipping mode based at least in part on the comparison.

At least one of the one or more switches can have a plurality of sub-switches, and at least one of the plurality of sub-switches can be configured to change a state based at least in part on an amount of current provided by the DC-DC voltage converter. Further, the mobile device can be configured to communicate using, for example, a 3G communications standard or a 4G communications standard. The mobile device can be configured, for example, as a smart phone or a tablet computer.

Another aspect of this disclosure is an apparatus that includes a switch matrix and control logic. The switch matrix can include switches configurable into a plurality of states corresponding to a plurality of voltage levels of an output voltage. The switch matrix may be configured to adjust a state of the plurality of states based at least in part on a mode control signal. The control logic may have a first input coupled to a voltage generated from a voltage supply and a second input coupled to a low noise voltage having noise features causing a distortion with a magnitude of no more than about 0.1% of a magnitude of the low noise signal voltage. The control logic may be configured to compare the voltage generated from the voltage supply with the low noise voltage and to generate the one or more mode control signals based at least in part on the comparison.

The low noise voltage can have noise that is one or two orders of magnitude less than the output voltage. The low noise voltage can have noise features causing a distortion with a magnitude of no more than about 0.05% of a magnitude of the low noise signal voltage Yet another aspect of this disclosure is a method that includes: comparing a first voltage generated from a voltage supply with a reference voltage independent of the voltage supply; generating a mode control signal based at least in part on the comparing; and adjusting a state of at least one switch in a switch matrix based on the mode control signal to adjust a voltage level of an output of the switch matrix. The method can also include additionally comparing a voltage indicative of the output of the switch matrix with the reference voltage, and generating the mode control signal can also be based on the additionally comparing. Moreover, the method can also include additionally comparing the reference voltage independent of the voltage supply with a second voltage generated from the voltage supply and having a different voltage level than the first voltage generated from the voltage supply, and generating the mode control signal can also be based on the additionally comparing.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

A number of signals are described herein as having logic low values and logic high values. Further, the functions of a number of systems are described as depending on the logic value of particular signals. It should be understood that in some cases the logic values selected are for example and that it is possible for the systems to function as described using reverse logic values. For instance, in some cases, V_UD may be set to logic high when V_OUT exceeds V_REF and V_UD may be set to logic low when V_REF exceeds V_OUT. In such cases, control circuitry may be modified to process the alternative logic signals.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having acts, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage converter comprising:
a switch configurable into a plurality of states corresponding to a plurality of voltage levels of an output voltage based at least in part on one or more switch control signals;
control logic configured to compare a first voltage with a second voltage, modify a frequency of an oscillator signal based at least in part on a result of the comparison, generate a switch control signal from the one or more switch control signals, and modify the frequency of the oscillator signal responsive to a change in a difference between the first voltage and the second voltage; and
an oscillator configured to generate the oscillator signal in response to a current of a voltage controlled current source, the current generated based at least in part on the result of the comparison of the first voltage with the second voltage.

2. The voltage converter of claim 1 wherein the control logic is further configured to reduce the frequency of the oscillator signal responsive to the difference between the first voltage and the second voltage decreasing.

3. The voltage converter of claim 1 wherein the switch is one of a plurality of switches included in a switch matrix.

4. The voltage converter of claim 1 wherein the control logic is further configured to adjust the frequency of the oscillator signal to a minimum frequency when the difference between the first voltage and the second voltage is negative.

5. The voltage converter of claim 1 wherein the control logic is further configured to transition the voltage converter into a pulse skipping mode based at least in part on the result of the comparison of the first voltage with the second voltage.

6. The voltage converter of claim 1 wherein the voltage controlled current source is an operational transconductance amplifier.

7. The voltage converter of claim 1 further comprising a capacitor in electrical communication with the switch.

8. The voltage converter of claim 7 further comprising a switch controller further configured to charge or discharge the capacitor based on the one or more switch control signals.

9. A voltage converter comprising:
a switch configurable into a plurality of states corresponding to a plurality of voltage levels of an output voltage based at least in part on one or more switch control signals;
control logic configured to compare a first voltage with a second voltage, modify a frequency of an oscillator signal based at least in part on a result of the comparison, generate a switch control signal from the one or more switch control signals, and modify the frequency of the oscillator signal responsive to a change in a difference between the first voltage and the second voltage; and
a clock generator configured to generate one or more clock signals for the switch, the one or more clock signals based at least in part on the oscillator signal.

10. A wireless device comprising:
a power amplifier configured to amplify a radio frequency input signal and to generate an amplified radio frequency output signal; and
a voltage converter including a switch, an oscillator, and control logic, the switch configurable into a plurality of states corresponding to a plurality of voltage levels of an output voltage based at least in part on one or more switch control signals, the switch configured to provide the radio frequency input signal to the power amplifier, the control logic configured to compare a first voltage and a second voltage, modify a frequency of an oscillator signal based at least in part on a result of the comparison, generate a switch control signal from the one or more switch control signals, and modify the frequency of the oscillator signal responsive to a change in a difference between the first voltage and the second voltage, and the oscillator configured to generate the oscillator signal in response to a current of a voltage controlled current source, the current generated based at least in part on the result of the comparison of the first voltage with the second voltage.

11. The wireless device of claim 10 wherein the control logic is further configured to reduce the frequency of the oscillator signal responsive to the difference between the first voltage and the second voltage decreasing.

12. The wireless device of claim 10 wherein the control logic is further configured to adjust the frequency of the oscillator signal to a minimum frequency when the difference between the first voltage and the second voltage is negative.

13. The wireless device of claim 10 wherein the control logic is further configured to transition the voltage converter into a pulse skipping mode based at least in part on the result of the comparison of the first voltage with the second voltage.

14. A wireless device comprising:
a power amplifier configured to amplify a radio frequency input signal and to generate an amplified radio frequency output signal; and
a voltage controller including a switch, a clock generator, and control logic, the switch configurable into a plurality of states corresponding to a plurality of voltage levels of an output voltage based at least in part on one or more switch control signals, the switch configured to provide the radio frequency input signal to the power amplifier, the control logic configured to compare a first voltage and a second voltage, modify a frequency of an oscillator signal based at least in part on a result of the comparison, generate a switch control signal from the one or more switch control signals, and modify the frequency of the oscillator signal responsive to a change in a difference between the first voltage and the second voltage, and the clock generator configured to generate one or more clock signals for the switch, the one or more clock signals based at least in part on the oscillator signal.

15. A multi-chip module comprising:
a power amplifier die including one or more power amplifiers; and
a controller die including a power amplifier bias controller configured to control a bias signal applied to the one or more power amplifiers and a voltage converter including a switch, a voltage controlled current source, and control logic, the switch configurable into a plurality of states corresponding to a plurality of voltage levels of an output voltage based at least in part on one or more switch control signals, the switch configured to provide a radio frequency input signal to a power amplifier of the one or more power amplifiers, the power amplifier configured to amplify the radio frequency input signal, the control logic configured to compare a first voltage and a second voltage, modify a frequency of an oscillator signal based at least in part on a result of the comparison, generate a switch control signal from the one or more switch control signals, and modify the frequency of the oscillator signal responsive to a change in a difference between the first voltage and the second voltage, and the voltage controlled current source configured to generate a current based at least in part on the result of the comparison.

16. The multi-chip module of claim 15 wherein the control logic is further configured to transition the voltage converter into a pulse skipping mode based at least in part on the result of the comparison of the first voltage with the second voltage.

17. The multi-chip module of claim 15 wherein the voltage converter further includes an oscillator configured to generate the oscillator signal based at least in part on the current.

* * * * *